(12) United States Patent
Washburn et al.

(10) Patent No.: US 9,960,038 B2
(45) Date of Patent: May 1, 2018

(54) PROCESSES TO PATTERN SMALL FEATURES FOR ADVANCED PATTERNING NEEDS

(75) Inventors: Carlton Ashley Washburn, Rolla, MO (US); James E. Lamb, III, Rolla, MO (US); Nickolas L. Brakensiek, St. James, MO (US); Qin Lin, Rolla, MO (US); Yubao Wang, Rolla, MO (US); Vandana Krishnamurthy, Rolla, MO (US); Claudia Scott, Sullivan, MO (US)

(73) Assignee: Brewer Science, Inc., Rolla, MO (US)

( * ) Notice: Subject to any disclaimer, the term of this patent is extended or adjusted under 35 U.S.C. 154(b) by 1280 days.

(21) Appl. No.: 13/335,357

(22) Filed: Dec. 22, 2011

(65) Prior Publication Data
US 2012/0164390 A1      Jun. 28, 2012

Related U.S. Application Data

(60) Provisional application No. 61/427,407, filed on Dec. 27, 2010.

(51) Int. Cl.
*G03F 7/26*      (2006.01)
*H01L 21/033*      (2006.01)
(Continued)

(52) U.S. Cl.
CPC ............ *H01L 21/0337* (2013.01); *C09D 5/00* (2013.01); *H01L 21/0338* (2013.01);
(Continued)

(58) Field of Classification Search
CPC . G03F 7/11; G03F 7/0035; G03F 7/40; H01L 21/0271; H01L 21/312;
(Continued)

(56) References Cited

U.S. PATENT DOCUMENTS 5,084,409 A      1/1992   Beam, III et al.
5,120,622 A *    6/1992   Hanrahan .................. 430/7
(Continued)

FOREIGN PATENT DOCUMENTS

JP      S64-003663      1/1989
JP      2004-087967     3/2004
(Continued)

OTHER PUBLICATIONS

Mebarki et al., "Innovative Self-Aligned Triple Patterning for 1x half pitch using Single 'Spacer Deposition-Spacer Etch' step," Proc. of SPIE, 2011, vol. 7973, 79730G-1-79730G-6.
(Continued)

*Primary Examiner* — Caleen Sullivan
(74) *Attorney, Agent, or Firm* — Hovey Williams LLP

(57) ABSTRACT

Methods of forming microelectronic structure are provided. The methods comprise the formation of T-shaped structures using a controlled undercutting process, and the deposition of a selectively etchable composition into the undercut areas of the T-shaped structures. The T-shaped structures are subsequently removed to yield extremely small undercut-formed features that conform to the width and optionally the height of the undercut areas of the T-shaped structures. These methods can be combined with other conventional patterning methods to create structures having extremely small feature sizes regardless of the wavelength of light used for patterning.

19 Claims, 23 Drawing Sheets

(51) Int. Cl.
*C09D 5/00* (2006.01)
*G03F 7/11* (2006.01)
*G03F 7/00* (2006.01)
*G03F 7/40* (2006.01)

(52) U.S. Cl.
CPC .............. *G03F 7/0035* (2013.01); *G03F 7/11* (2013.01); *G03F 7/40* (2013.01); *Y10T 428/24612* (2015.01)

(58) Field of Classification Search
CPC ......... H01L 21/0272; H01L 2224/1147; H01L 2224/11472; H01L 24/11; H01L 2924/14
USPC .......................................... 430/315, 314, 313
See application file for complete search history.

(56) References Cited

U.S. PATENT DOCUMENTS

| | | | |
|---|---|---|---|
| 5,972,568 A * | 10/1999 | Seniuk et al. ............... | 430/312 |
| 6,051,506 A | 4/2000 | Kim et al. | |
| 6,605,412 B2 * | 8/2003 | Iwata et al. ................... | 430/311 |
| 6,812,077 B1 | 11/2004 | Chan et al. | |
| 6,872,506 B2 | 3/2005 | Neef et al. | |
| 7,261,997 B2 | 8/2007 | Cox et al. | |
| 7,364,835 B2 | 4/2008 | Bhave et al. | |
| 7,585,614 B2 | 9/2009 | Furukawa et al. | |
| 7,601,483 B2 | 10/2009 | Guerrero et al. | |
| 7,720,632 B2 | 5/2010 | Kurihara et al. | |
| 7,914,974 B2 | 3/2011 | Guerrero et al. | |
| 2005/0159009 A1 | 7/2005 | Makiyama et al. | |
| 2006/0281266 A1 | 12/2006 | Wells | |
| 2007/0207406 A1 | 9/2007 | Guerrero et al. | |
| 2008/0076064 A1 | 3/2008 | Sun | |
| 2009/0035590 A1 | 2/2009 | Sullivan et al. | |
| 2009/0111281 A1 | 4/2009 | Bencher et al. | |
| 2010/0136792 A1 | 6/2010 | Mebarki et al. | |
| 2010/0170868 A1 | 7/2010 | Lin et al. | |
| 2010/0173498 A1 | 7/2010 | Abatchev et al. | |

FOREIGN PATENT DOCUMENTS

| | | |
|---|---|---|
| JP | 2009-002785 | 1/2009 |
| JP | 2009-529784 | 8/2009 |
| JP | 2010-152029 | 7/2010 |

OTHER PUBLICATIONS

International Search Report and Written Opinion dated Aug. 29, 2012 in corresponding PCT/US2011/066910 filed on Dec. 22, 2011.
International Preliminary Report on Patentability dated Jul. 11, 2013 in corresponding PCT/US2011/066910 filed on Dec. 22, 2011.
JPS64-003663 Abstract Only in English, 1 page.
English Translation of JPS64-003663; 9 pages.
Machine translation of JP2010-152029, 13 pages.

* cited by examiner

PROCESSES TO PATTERN SMALL FEATURES FOR ADVANCED PATTERNING NEEDS

CROSS-REFERENCE TO RELATED APPLICATIONS

The present application claims the priority benefit of U.S. Provisional Patent Application Ser. No. 61/427,407, filed Dec. 27, 2010, entitled PROCESSES TO PATTERN SMALL FEATURES FOR ADVANCED PATTERNING NEEDS, incorporated by reference in its entirety herein.

BACKGROUND OF THE INVENTION

Field of the Invention

The present invention relates to processes capable of forming microelectronic structures having small features (≤20 nm) using freestanding T-shaped template structures.

Description of Related Art

As features shrink to meet the demands of more efficient device performance, improved materials and processes are needed. The most common form of improvement over the decades has been reducing the wavelength of radiation (e.g., g-line at 436 nm, i-line at 365 nm, KrF at 248 nm, and ArF at 193 nm) used for patterning to improve resolution according to the Rayleigh criteria. In some cases, smaller features can be printed, but the pitch of these features is large due to contrast limitations. The next step in wavelength reduction is extreme ultraviolet (EUV) lithography at 13.5 nm, which progresses into the x-ray range of optics and thus brings a host of problems, including cost.

Multiple patterning processes have also been proposed for feature size reduction. Multi-patterning technology usually takes the form of repeating lithography and etch processes. For example, it is typically a lithography-etch-lithography-etch process for double patterning, and lithography-etch-lithography-etch-lithography-etch for triple patterning. However, double patterning has a serious issue of overlay and alignment, which prevents this technology from being used to fabricate dense lines (line:space=1:1). Triple patterning compounds this issue, as it involves two lithography steps that require alignment.

To address the issue of overlay, the CVD spacer process, which involves CVD underlayer-lithography-etch-CVD conformal film-etch, was developed to eliminate the second lithography step. This technology has been successfully used in mass production of dense lines with 32 nm and 28 nm, and has been extended to CVD underlayer-lithography-etch-CVD conformal film-etch-CVD conformal film-etch triple patterning. However, this scheme contains numerous CVD and etch steps, which result in not only high cost but also many technical challenges due to the accumulation of process errors for each step.

To address the cost and technical difficulties of the spacer process, some modified methods have been proposed to reduce the number of steps. For example, the photoresist pattern could be directly used as the template for a conformal film to prepare underlayers, eliminating the initial CVD steps, along with using a post-lithography etch to prepare the template. The conformal coating can be applied on the photoresist template by a CVD process. However, the feasibility of this process is still under question, because a CVD process is always performed at a high temperature, which can damage the photoresist pattern. To address the issue of the difficulty of a CVD process, a spin-on process at a low temperature has been developed, and can be extended to triple patterning as lithography-etch-lithography-spin-on conformal film-etch. But this triple-patterning process has two lithography steps and still has the issue of overlay.

Thus, there remains a need in the art for technology that allows current ArF lithography techniques to be used to create features that typically could only be patterned using an EUV light source. Advantageously, this would eliminate the capital outlay for an EUV tool, save a tremendous amount of money for the manufacturer, and allow existing logistics and materials to be used, saving even more money and resources.

SUMMARY OF THE INVENTION

The present invention is broadly concerned with methods of forming microelectronic structures, and the structures resulting therefrom.

A method of forming a microelectronic structure is provided. The method comprises providing a wafer stack comprising a substrate having a surface, an optional intermediate layer adjacent the substrate surface, an undercuttable layer adjacent the substrate surface or optional intermediate layer, when present, and an imaging layer adjacent the undercuttable layer. The imaging layer is patterned to yield a pattern. The pattern is transferred into the undercuttable layer to yield a first plurality of T-shaped structures on the substrate surface, or on an intermediate layer on the substrate surface. The T-shaped structures each comprise an upright leg having an upper portion and a lower portion joined by opposing vertical sidewalls that are generally perpendicular to the substrate surface, the lower portion contacting the substrate surface or intermediate layer; and a generally horizontal section being adjacent the upper portion, and generally perpendicular to the vertical sidewalls, the generally horizontal section comprising an upper surface and a lower surface joined by opposing endwalls. Each of the vertical sidewalls and the lower surface cooperatively define a first set of undercut areas. The first set of undercut areas are filled with a selectively etchable composition. The T-shaped structures are removed to yield a first plurality of undercut-formed features on the substrate surface or intermediate layer, when present.

A further method of forming a microelectronic structure is also provided. The method comprises providing a stack comprising a substrate having a surface, an optional intermediate layer adjacent the substrate surface, and a first pattern formed in and/or on the substrate surface or intermediate layer, when present. The first pattern comprises a plurality of initial features formed on the substrate surface or intermediate layer, and the initial features formed on the substrate surface or intermediate layer each have a respective height. An undercuttable layer is formed adjacent the substrate surface or intermediate layer, when present, at an average thickness substantially equal to or greater than the height of the initial features. An imaging layer is formed on the undercuttable layer and initial features, and is patterned to yield a second pattern. The second pattern is transferred into the undercuttable layer to yield a plurality of T-shaped structures on the substrate surface, or on an intermediate layer on the substrate surface. Each of the T-shaped structures comprises an upright leg having an upper portion and a lower portion joined by opposing vertical sidewalls that are generally perpendicular to the substrate surface, and a core corresponding to the initial features, the lower portion contacting the substrate surface or intermediate layer; and a generally horizontal section being adjacent the upper portion, and generally perpendicular to the vertical sidewalls.

The generally horizontal section comprises an upper surface and a lower surface joined by opposing endwalls, wherein each of the vertical sidewalls and the lower surface cooperatively define a set of undercut areas.

The invention provides a further method of forming a microelectronic structure. The method comprises providing a precursor structure comprising a substrate having a surface and an optional intermediate layer adjacent the substrate surface; and a first plurality of T-shaped structures on the substrate surface, or on the intermediate layer, when present. The first plurality of T-shaped structures each comprise an upright leg having an upper portion and a lower portion joined by opposing vertical sidewalls that are generally perpendicular to the substrate surface, the lower portion contacting the substrate surface or intermediate layer; and a generally horizontal section being adjacent the upper portion, and generally perpendicular to the vertical sidewalls. The generally horizontal section comprises an upper surface and a lower surface joined by opposing endwalls, wherein each of the vertical sidewalls and the lower surface cooperatively define a first set of undercut areas. The first set of undercut areas are filled with a first selectively etchable composition, and a second plurality of T-shaped structures are formed adjacent the substrate surface or intermediate layer, when present. The second plurality of T-shaped structures each comprise an upright leg having an upper portion and a lower portion joined by opposing vertical sidewalls that are generally perpendicular to the substrate surface, the lower portion contacting the substrate surface or intermediate layer; and a generally horizontal section being adjacent the upper portion, and generally perpendicular to the vertical sidewalls. The generally horizontal section comprises an upper surface and a lower surface joined by opposing endwalls, wherein each of the vertical sidewalls and the lower surface cooperatively define a second set of undercut areas. The second set of undercut areas are filled with a second selectively etchable composition. The first and second plurality of T-shaped structures are removed to yield a first and second plurality of undercut-formed features on the substrate surface or intermediate layer, when present. The first plurality of undercut-formed features correspond to the first selectively etchable composition, and the second plurality of undercut-formed features correspond to the second selectively etchable composition.

A further method of forming a microelectronic structure is provided. The method comprises providing a precursor structure comprising a substrate having a surface and an optional intermediate layer adjacent the substrate surface; and a first plurality of T-shaped structures on the substrate surface, or on an intermediate layer on the substrate surface. The T-shaped structures each comprise an upright leg having an upper portion and a lower portion joined by opposing vertical sidewalls that are generally perpendicular to the substrate surface, the lower portion contacting the substrate surface or intermediate layer; and a generally horizontal section being adjacent the upper portion, and generally perpendicular to the vertical sidewalls. The generally horizontal section comprises an upper surface and a lower surface joined by opposing endwalls, wherein each of the vertical sidewalls and the lower surface cooperatively define a first set of undercut areas. A first selectively etchable composition is applied to the precursor structure, the selectively etchable composition flowing into the first set of undercut areas and coating the substrate surface, or intermediate layer, when present. The selectively etchable composition is applied at an average thickness substantially equal to or greater than the height of the upright leg of the first plurality of T-shaped structures so as to contact the lower surface of the generally horizontal section of the first plurality of T-shaped structures. A second plurality of T-shaped structures are formed on the first selectively etchable composition. The second plurality of T-shaped structures each comprise an upright leg having an upper portion and a lower portion joined by opposing vertical sidewalls that are generally perpendicular to the substrate surface, the lower portion contacting the substrate surface or intermediate layer; and a generally horizontal section being adjacent the upper portion, and generally perpendicular to the vertical sidewalls. The generally horizontal section comprises an upper surface and a lower surface joined by opposing endwalls, wherein each of the vertical sidewalls and the lower surface cooperatively define a second set of undercut areas. The second set of undercut areas are filled with a second selectively etchable composition, and the first and second plurality of T-shaped structures are removed to yield a first and second plurality of undercut-formed features on the substrate surface or intermediate layer, when present. The first plurality of undercut-formed features correspond to the first selectively etchable composition, and the second plurality of undercut-formed features correspond to the second selectively etchable composition.

The invention provides a further method of forming a microelectronic structure. The method comprises providing a precursor structure comprising a substrate having a surface and an optional intermediate layer adjacent the substrate surface; and a plurality of T-shaped structures on the substrate surface, or on an intermediate layer on the substrate surface. The T-shaped structures each comprise an upright leg having an upper portion and a lower portion joined by opposing vertical sidewalls that are generally perpendicular to the substrate surface, the lower portion contacting the substrate surface or intermediate layer; and a generally horizontal section being adjacent the upper portion, and generally perpendicular to the vertical sidewalls. The generally horizontal section comprises an upper surface and a lower surface joined by opposing endwalls, wherein each of the vertical sidewalls and the lower surface cooperatively define a first set of undercut areas. The first set of undercut areas are filled with a first selectively etchable composition. A first conformal layer is formed adjacent the T-shaped structures and the substrate surface or intermediate layer, when present. A second conformal layer is formed adjacent the first conformal layer, and the T-shaped structures and portions of first and second conformal layer are removed to yield a plurality of undercut-formed features and a plurality of conformally-formed features on the substrate surface or intermediate layer, when present.

A further method of forming a microelectronic structure is also provided. The method comprises providing a precursor structure comprising: a substrate having a surface and an optional intermediate layer adjacent the substrate surface; a first etch transfer layer adjacent the substrate surface or intermediate layer, when present; a first hardmask adjacent the etch transfer layer; and a first plurality of undercut-formed features adjacent the hardmask defining a first pattern. The first pattern is transferred into the first hardmask to yield a first patterned hardmask. A second etch transfer layer is formed on the precursor structure, which overcoats the patterned hardmask. A second hardmask layer is formed adjacent the second etch transfer layer. A second plurality of undercut-formed features are created adjacent the second hardmask layer to yield a second pattern. The second pattern is transferred into the second hardmask layer to yield a second patterned hardmask, and the first and second pattern are etched into the first and second etch transfer layers using the first and second patterned hardmasks as an etch stop.

A microelectronic structure is also provided. The structure comprises a substrate having a surface, an optional intermediate layer adjacent the surface, and a plurality of undercut-formed features adjacent the substrate surface, or the intermediate layer, when present. The undercut-formed features have a width of less than about 20 nm and comprise a selectively etchable composition. The selectively etchable composition comprises silicon- and/or metal-containing compounds, oxides thereof, or a combination thereof.

A further microelectronic structure is also provided. The structure comprises a substrate having a surface, an optional intermediate layer adjacent the surface, and a plurality of T-shaped structures on the substrate surface, or the intermediate layer, when present. The T-shaped structures each comprise an upright leg having an upper portion and a lower portion joined by opposing vertical sidewalls that are generally perpendicular to the substrate surface, the lower portion contacting the substrate surface or intermediate layer; and a generally horizontal section being adjacent the upper portion, and generally perpendicular to the vertical sidewalls. The generally horizontal section comprises an upper surface and a lower surface joined by opposing endwalls, wherein each of the vertical sidewalls and the lower surface cooperatively define a first set of undercut areas, and a selectively etchable composition filling the undercut areas. The selectively etchable composition comprises silicon- and/or metal-containing compounds, oxides thereof, or a combination thereof.

DETAILED DESCRIPTION

Methods of the Invention

Figure 1A:
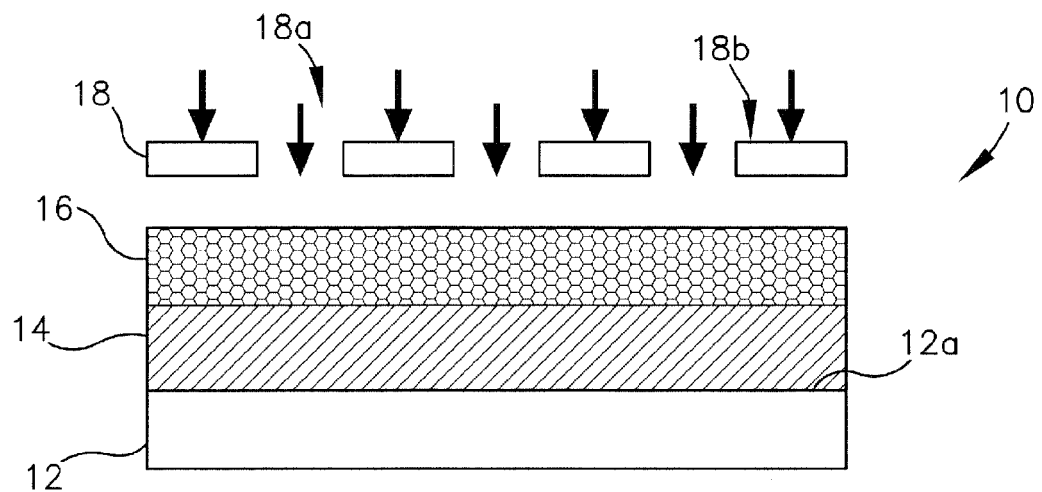
FIGS. 1(A)-(E) illustrate a schematic cross-section of a process of forming a microelectronic structure according to one embodiment of the invention.

In one aspect of the inventive method, as shown in FIG. 1(A), a wafer stack 10 is provided. The stack 10 includes a substrate 12, which can be any conventional microelectronic substrate. Preferred substrates include those selected from the group consisting of silicon, SiGe, $SiO_7$, $Si_3N_4$, SiON, aluminum, tungsten, tungsten silicide, gallium arsenide, germanium, tantalum, tantalum nitride, coral, black diamond, phosphorous or boron doped glass, $Ti_3N_4$, hafnium, $HfO_2$, ruthenium, indium phosphide, and mixtures of the foregoing. The substrate has a surface 12a, which can be planar, or it can include topography features (e.g., via holes, trenches, contact holes, raised features, lines, etc.) (not shown). As used herein, "topography" refers to the height or depth of a structure in or on a substrate surface (or intermediate layers that may be present on the substrate surface).

An undercuttable composition is applied to the substrate 12 to form an undercuttable layer 14. In some embodiments, the undercuttable layer 14 is formed directly adjacent the substrate surface 12a (i.e., without any intermediate layers between the undercuttable layer 14 and substrate 12). In other embodiments, intermediate layers are present between the undercuttable layer 14 and substrate 12 (not shown). Suitable compositions for use as undercuttable layer 14 are discussed in more detail below. The composition can be applied by any known application method, with one preferred method being spin-coating the composition at speeds of from about 500 rpm to about 5,000 rpm (preferably from about 1,000 rpm to about 3,000 rpm) for a time period of from about 15 seconds to about 90 seconds (preferably from about 30 seconds to about 60 seconds). After the composition is applied, it is preferably heated to a temperature of from about 160° C. to about 200° C., and more preferably from about 170° C. to about 190° C. and for time periods of from about 15 seconds to about 90 seconds (preferably from about 45 seconds to about 60 seconds). Depending upon the composition used to form the undercuttable layer 14, baking can also initiate a crosslinking reaction to cure the layer 14. The baking process can then be quenched using a chill plate at from about 10° C. to about 25° C. (preferably from about 19° C. to about 23° C.), for time periods of from about 10 seconds to about 90 seconds. It will be appreciated by those in the art that in each of the baking steps used to form the layers as described below, a chill plate (–19-23° C.) can be used to quench the baking process before proceeding with subsequent processing of the stack.

The average thickness of the undercuttable layer 14 (determined after baking) is preferably from about 1 nm to about 100 nm, more preferably from about 10 nm to about 80 nm, and most preferably from about 20 nm to about 50 nm. If the substrate surface 12a includes topography, the undercuttable layer 14 is preferably applied at a thickness sufficient to substantially cover the substrate topography and to achieve the above average thicknesses over the topography. Depending upon the composition used to form the undercuttable layer 14 (discussed in more detail below), the dried or crosslinked undercuttable layer 14 can have a refractive index (n value) of from about 0.1 to about 2.5, more preferably from about 1 to about 2, and even more preferably from about 1.6 to about 1.8 at the wavelength of use (e.g., 365 nm, 248 nm, 193 nm, 157 nm, or 13.5 nm, with 193 and 248 nm being the most preferred). The dried or crosslinked undercuttable layer 14 can also have an extinction coefficient (k value) of from about 0 to about 1, more preferably from about 0.3 to about 0.6, and even more preferably from about 0.4 to about 0.5 at the wavelength of use (e.g., 365 nm, 248 nm, 193 nm, 157 nm, or 13.5 nm, with 193 and 248 nm being the most preferred).

The dried or crosslinked undercuttable layer 14 in some embodiments will be substantially insoluble in typical organic solvents used to form subsequent layers in the multilayer stack, such as propylene glycol methyl ether acetate (PGMEA), propylene glycol monomethyl ether (PGME), ethyl lactate (EL), propylene glycol n-propyl ether (PnP), gamma-butyrolactone (GBL), cyclopentanone, cyclohexanone, n-butyl acetate, methyl isobutyl carbinol (MIBC), and mixtures thereof. Thus, when subjected to a stripping test, the undercuttable layer 14 will have a percent stripping of less than about 5%, preferably less than about 1%, and more preferably about 0%. The stripping test involves first determining the thickness by taking the average of measurements at five different locations of the layer. This is the initial average film thickness. Next, the film is rinsed with a solvent (e.g., ethyl lactate) for about 30 seconds, followed by spin drying at about 500-3,000 rpm for about 20-60 seconds to remove the solvent. The thickness is measured again at those five points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

Although typically insoluble in organic solvents, the undercuttable layer 14 in some embodiments is soluble or capable of being rendered soluble in conventional aqueous developers (e.g., photoresist developers). Particularly preferred developers are selected from the group consisting of tetramethyl ammonium hydroxide (TMAH), potassium hydroxide (KOH), sodium hydroxide, and mixtures thereof. In some embodiments, the undercuttable layer 14 is photosensitive and is rendered soluble in developer only upon exposure to radiation (e.g., light). For example, when a cured undercuttable layer 14 is used, the layer 14 will also be insoluble in typical developers until exposed to radiation to decrosslink the layer 14. In other embodiments, the undercuttable layer 14 is not photosensitive (i.e., a pattern cannot be defined in the layer when it is exposed to about 1 J/cm$^2$). That is, the undercuttable layer 14 does not undergo any physical or chemical change during exposure to radiation (i.e., light). Accordingly, the undercuttable layer 14 does not need to be exposed to radiation to be rendered soluble in developer. Thus, in some embodiments, the undercuttable layer 14 advantageously can be removed during processing without dry etching (e.g., reactive ion etching), and in some embodiments is preferably not subjected to dry etching to form the T-shaped structures of the invention (discussed in more detail below). In other embodiments, a composition suitable for dry etching can be used to form the undercuttable layer 14.

An imaging layer 16 is then formed adjacent the undercuttable layer 14. Suitable imaging compositions include any photosensitive compositions, such as commercially-available photoresists (e.g., TArF Pi6-001 from TOK, Kawasaki shi, Kanagawa (Japan); ARX3001, ARX3340J, AM2073J, and KrFM592Y from JSR Micro, Sunnyvale, Calif.; SAIL-X-181, Shin-Etsu, Tokyo (Japan)), or photosensitive anti-reflective compositions. The resulting stack 10 is shown in FIG. 1(A). The imaging layer 16 can be formed by any known application method, with one preferred method being spin-coating at speeds of from about 500 to about 5,000 rpm (preferably from about from about 1,000 to about 2,000 rpm) for a time period of from about 30 to about 120 seconds (preferably from about 45 to about 60 seconds). The imaging layer 16 is then post-application baked ("PAB") at a temperature of at least about 90° C., and preferably from about 90° C. to about 130° C., for time periods of from about 30 seconds to about 120 seconds (preferably 45 to about 60 seconds). The thickness of the imaging layer 16 (after baking) is preferably from about 1 nm to about 500 nm, more preferably from about 50 mm to about 300 nm, and even more preferably from about 100 nm to about 200 nm.

As shown in FIG. 1(A), the imaging layer 16 can then be patterned by exposure to light of the appropriate wavelength (e.g., 13.5 nm (EUV), 193 nm, 248 nm, or 365 nm). More specifically, the imaging layer 16 is exposed using a mask 18 positioned above the imaging layer 16. The mask 18 has open areas 18a designed to permit radiation (hv) to pass through the mask 18 and contact the imaging layer 16. The remaining solid portions 18b of the mask 18 are designed to prevent radiation from contacting the imaging layer 16 in certain areas. Those skilled in the art will readily understand that the arrangement of open areas 18a and solid portions 18b is designed based upon the desired pattern to be formed in the imaging layer 16 and ultimately in the substrate 12. After exposure, the imaging layer 16 is preferably subjected to a post-exposure bake ("PEB") at a temperature of from about 80° C. to about 130° C., more preferably from about 100° C. to about 120° C. for a time period of from about 45 seconds to about 90 seconds.

Figure 1B:
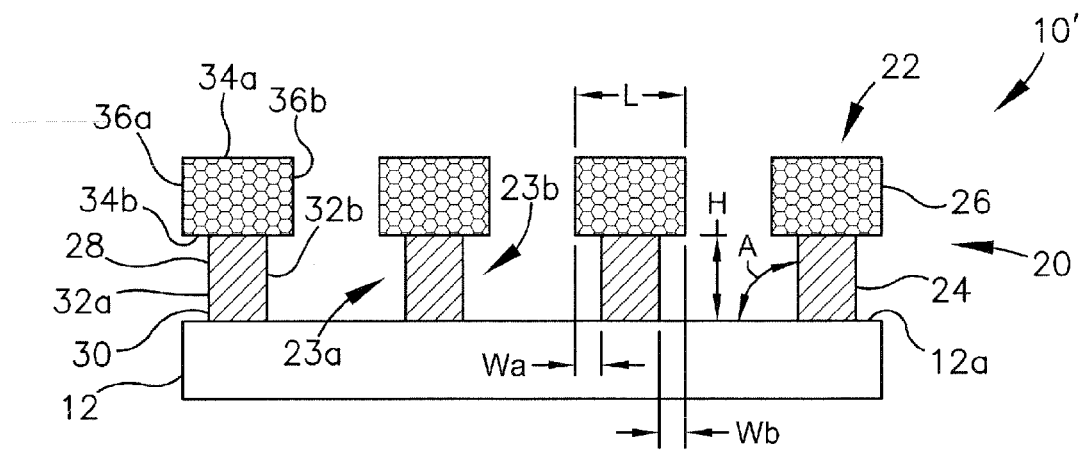

The imaging layer 16 is then developed and the resulting pattern is transferred into the undercuttable layer 14 to yield a patterned stack 10'. More specifically, upon exposure, the portions of the imaging layer 16 that are exposed to radiation are rendered soluble in aqueous developer. As shown in FIG. 1(B), the exposed portions of the imaging layer 16 that were made soluble by the above process, are then contacted with an aqueous developer to remove the exposed portions to form the desired pattern 20 in the imaging layer 16. Portions of the undercuttable layer 14 adjacent the exposed portions of the imaging layer 16 are then removed. In one embodiment, the undercuttable layer 14 can be removed using a solvent or aqueous developer (e.g., the developer used to remove the exposed portions of the imaging layer 16). In another embodiment, the undercuttable layer 14 can be removed using a dry etching process and the imaging layer 16 as a mask. For example, RIE using a suitable etch gas (depending on the chemistry of the undercuttable layer 14) can be used to transfer the pattern into the undercuttable layer 14. Regardless of the embodiment, the pattern transfer process causes lateral etching of the undercuttable layer 14 underneath the non-light exposed portions of the imaging layer 16. Although it will vary depending upon the composition used to form the layer, the undercuttable layer 14 in some embodiments will preferably have an etch or develop rate of from about 0.1 nm/second to about 10 nm/second, more preferably from about 1 nm/second to about 5 nm/second, and even more preferably from about 2 nm/second to about 4 nm/second.

The undercuttable layer 14 and imaging layer 16 may have the same etch or develop rates, or they may have different etch or develop rates. If the etch or develop rates are the same, then the undercuttable layer 14 and imaging layer 16 will be etched or developed substantially simultaneously to yield structures having vertical sidewalls without any undercutting. A suitable solvent, developer, or dry etch process can then be used to remove portions of the undercuttable layer 14 under the edges of the nonexposed portions of the imaging layer 16. The undercuttable layer 14 and imaging layer 16 may also have different etch or develop rates. In this aspect, the undercuttable layer 14 preferably etches or develops at a rate that is faster than the imaging layer 16, so that the undercut areas will be formed in a single etching or development step. Depending upon the composition used to form the undercuttable layer 14, it will be appreciated that the amount of lateral etching can be increased as wet or dry etching time is increased. In embodiments using a crosslinkable undercuttable layer 14, the amount of lateral etching can be varied by decreasing the crosslinking temperature so that the layer develops faster during pattern transfer. For photosensitive undercuttable layers 14, the temperature or time of the PEB can be changed to vary the acid diffusion rate in the layer. Those skilled in the art will readily appreciate, based upon the present disclosure and knowledge in the art, that additional modifications may be made to the exposure and/or development process to affect the degree of lateral etching of the undercuttable layer 14.

After developer contact or dry etching, freestanding T-shaped structures 22 remain on surface 12a of substrate 12, or on any intermediate layers that are included on surface 12a. T-shaped structures 22 each comprise an upright leg 24 (formed of one material) and a generally horizontal section 26 (formed of a second material), which cooperatively define undercut areas 23a, 23b. Legs 24 are chemically identical to the undercuttable layer 14 after baking, and comprise upper and lower portions 28, 30 joined by opposing vertical sidewalls 32a, 32b. Sidewalls 32a, 32b are generally parallel to one another, and are also generally perpendicular to substrate surface 12a, with lower portion 30 contacting surface 12a, or any intermediate layers that may be present on surface 12a. That is, the angle A formed by a vertical sidewall 32a or 32b and substrate surface 12a (or any intermediate layers, when present) is from about 70° to about 110°, more preferably from about 80° to about 100°, and even more preferably from about 85' to about 95°.

Sections 26 are chemically identical to the non-exposed portions of imaging layer 16 after baking, and comprise respective upper and lower surfaces 34a, 34b and endwalls 36a, 36b. Each section 26 has a length L, which is the greatest distance measured between endwalls 36a, 36b. L will preferably range from about 10 nm to about 1,000 nm, more preferably from about 20 nm to about 100 nm, and most preferably from about 38 nm to about 45 nm. Upper and lower surfaces 34a, 34b are generally parallel to one another and to surface 12a, while endwalls 36a, 36b are generally parallel to one another and to sidewalk 32a, 32b, while being generally perpendicular to surface 12a. Lower surface 34b of section 26 is adjacent upper portion 28 of leg 24. Upright legs 24 each have a height H that is defined by the maximum distance between the substrate surface 12a (or any intermediate layers, when present) and lower surface 34b. This height H will generally correspond to the thickness of the undercuttable layer 14, described above, and will preferably range from about 1 nm to about 100 nm, more preferably from about 20 nm to about 60 nm, and most preferably from about 30 nm to about 50 nm.

Undercut area 23a has a width Wa, which is measured as the maximum distance between sidewall 32a and the plane defined by endwall 36a. Likewise, undercut area 23b has a width Wb, which is measured as the maximum distance between sidewall 32b and the plane defined by endwall 36b. Advantageously, this process allows the width Wa, Wb to be controlled and made relatively small without losing any of the overall height of legs 24 during etching or other processing. The inventive process can result in a Wa or Wb of from about 1 nm to about 100 nm, preferably from about 1 nm to about 50 nm, and even more preferably from about 1 nm to about 20 nm. Preferably, Wa or Wb is from about 0.5% to about 49% of the length L of section 26, more preferably from about 10% to about 40% of L, and even more preferably from about 20% to about 35% of L. It will be appreciated that there may be slight variations among the features formed using the inventive methods, and a small percentage of each feature type (e.g., undercut areas, undercut-formed features, T-shaped structures, etc.) may fall outside of the above parameters without departing from the scope of the invention. Thus, for each measurement described herein, it will be understood that at least about 50% of the respective features for each feature type will meet the defined ranges, preferably at least about 75%, and more preferably at least about 90% of the respective features will meet the defined ranges.

Figure 1C:
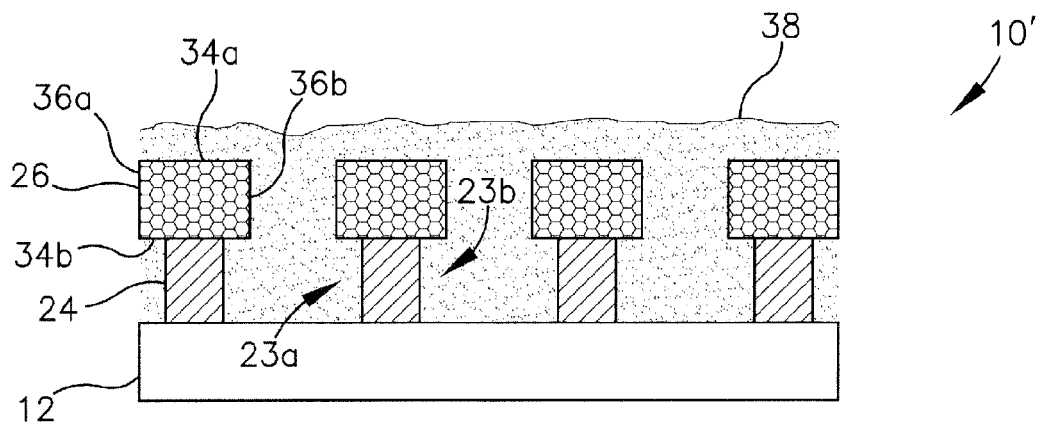

As shown in FIG. 1(C), a selectively etchable composition 38 is coated onto the patterned stack 10' comprising the T-shaped structures 22, filling the undercut areas 23a, 23b so that it contacts the sidewalls 32a, 32b, and optionally lower surface 34b of the T-shaped structures 22. The selectively etchable composition 38 can be applied using any suitable method, with one preferred method being spin-coating the composition at speeds of from about 100 rpm to about 5,000 rpm (preferably from about 500 rpm to about 3,000 rpm) for a time period of from about 15 seconds to about 90 seconds (preferably from about 30 seconds to about 60 seconds). After the composition is applied, it is preferably heated to a temperature of from about 50° C. to about 300° C., and more preferably from about 80° C. to about 120° C., and for time periods of from about 15 seconds to about 90 seconds (preferably from about 30 seconds to about 60 seconds) to evaporate solvents. The selectively etchable composition 38 is preferably applied at an average thickness sufficient to fill the undercut areas 23a, 23b, such that the composition 38 contacts the sidewalls 32a, 32b, and optionally, lower surface 34b of the T-shaped structures 22. In some cases, the selectively etchable composition 38 will overcoat the T-shaped structures 22. The average thickness of the selectively etchable composition 38, will preferably range from about 1 nm to about 1,000 nm, more preferably from about 1 nm to about 100 nm, and most preferably from about 1 nm to about 50 nm. Suitable selectively etchable compositions for use in the invention are discussed in more detail below.

As shown in FIG. 1(D), the selectively etchable composition 38 is then selectively removed using the T-shaped structures 22 as a mask, leaving selectively etchable composition 38 only in the undercut areas 23a, 23b. Preferably, RIE is used to selectively remove the selectively etchable composition 38 using a reactive ion plasma of $CF_4$, $CHF_3$, $O_2$, HBr, $Cl_2$, $ST_6$, $C_2F_6$, $C_4F_8$, CO, $CO_2$, $N_2$, $H_2$, $C_4H_8$, Ar, $N_2H_2$, He, $CH_2F_2$, or a mixture thereof. Etching time will vary depending upon the materials used in the stack 10; however, it will generally range from about 1 to about 120 seconds, preferably from about 15 to about 90 seconds, and even more preferably from about 30 to about 60 seconds.

As shown in FIG. 1(E), the imaging layer 16 and undercuttable layer 14 (i.e., generally horizontal sections 26 and upright legs 24, respectively) are then removed using a solvent, developer, dry etch, or a combination thereof. In one embodiment, removal can be carried out with a further dry etch step using a reactive ion plasma of $CF_4$, $CHF_3$, $O_2$, HBr, $Cl_2$, $SF_6$, $C_2F_6$, $C_4F_8$, CO, $CO_2$, $N_2$, $H_2$, $C_4H_8$, Ar, $N_2H_2$, He, $CH_2F_2$, or a mixture thereof, wherein the etch gas(es) used to remove the undercuttable layer 14 and imaging layer 16 are different from the etch gases used to selectively remove the selectively etchable composition 38, above. Removal of the undercuttable layer 14 and imaging layer 16 can also be carried out using a solvent such as N-methylpyrrolidone (NMP), MIBC, PGME, PGMEA, EL, cyclohexanone, PnP, GBL, 2-heptanone, and n-butyl acetate, or a developer such as tetramethylammonium hydroxide (TMAH), potassium hydroxide (KOH), and any suitable inorganic alkaline solutions. The solvent or developer can be puddled onto the surface of the stack for a sufficient time period to dissolve the layers (e.g., from about 1 to about 120 seconds, preferably from about 30 to about 60 seconds), followed by rinsing and spin-drying. Alternatively, the stack can be immersed in the solvent or developer for a sufficient time period to dissolve the layers, followed by spin-drying.

Regardless of the embodiment, after removal of the imaging layer 16 and undercuttable layer 14, undercut-formed features 40 remain on the substrate surface 12a, or on intermediate layers that might be present on the surface 12a. The undercut-formed features 40 are chemically identical to the dried or cured selectively etchable composition 38 that was deposited into undercut areas 23a, 23b. The undercut-formed features 40 will each have a width w that substantially corresponds to the width Wa, Wb of undercut areas 23a, 23b. More specifically, the width w of the undercut-formed features 40 will preferably range from about 1 nm to about 100 nm, more preferably from about 5 nm to about 30 nm, and most preferably from about 10 nm to about 20 nm. The height h of the undercut-formed features 40 will substantially correspond to the height H of the upright leg 24. More specifically, the height h of the undercut-formed features 40 will preferably range from about 1 nm to about 100 nm, more preferably from about 20 nm to about 60 nm, and most preferably from about 30 nm to about 50 nm. The ratio of w:h will preferably be from about 10:1 to about 1:10, more preferably from about 1:1 to about 1:5, and even more preferably from about 1:1 to about 1:3. It will be appreciated that the height h of the final undercut-formed features 40 can be adjusted by adjusting the thickness of the undercuttable layer 14, while the width w can be controlled by adjusting the amount of undercut or the etch process used for undercutting. The pitch of the undercut formed features can be changed by adjusting the linewidth of the pattern, or by using a multiple-patterning approach, such as one described herein.

Figure 2A:
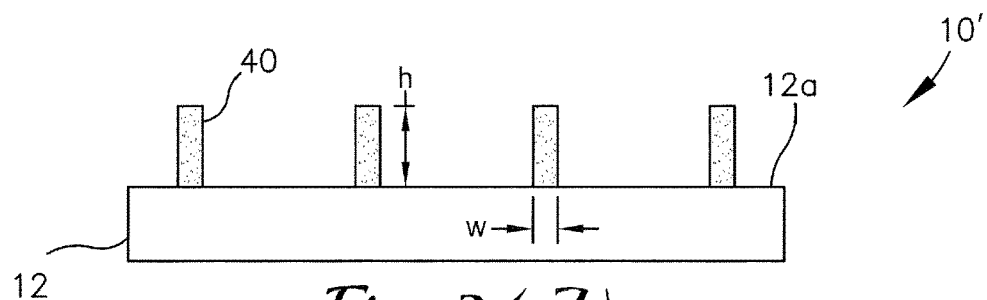
FIGS. 2(A)-(F) illustrate a schematic cross-section of a process of forming a microelectronic structure according to a further embodiment of the invention.
Figure 2B:
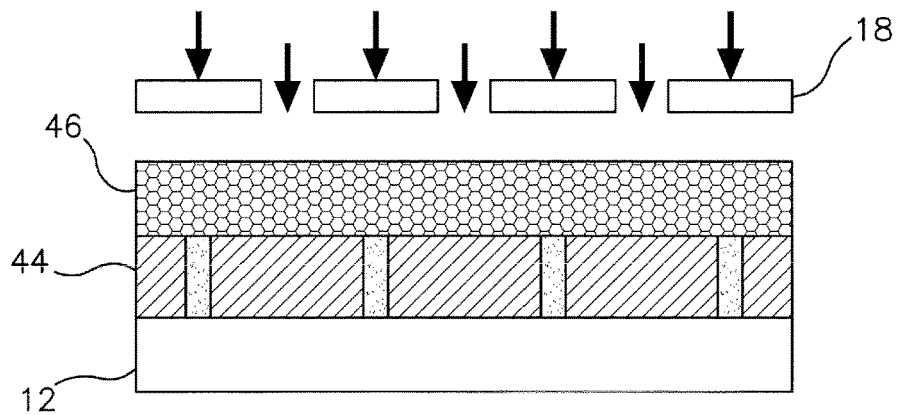
Figure 2C:
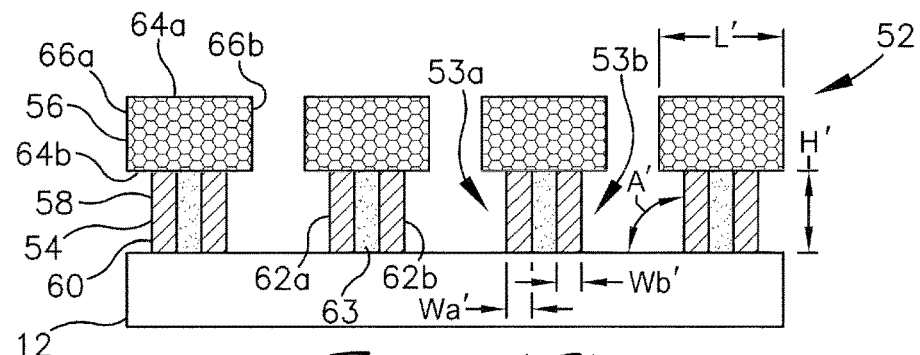
Figure 2D:
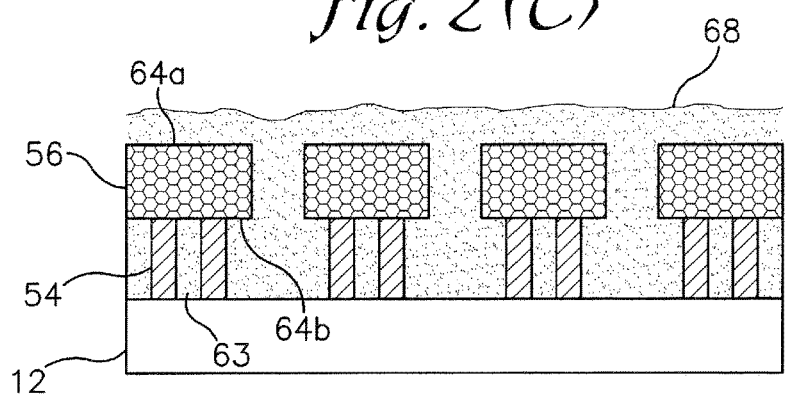
Figure 2:
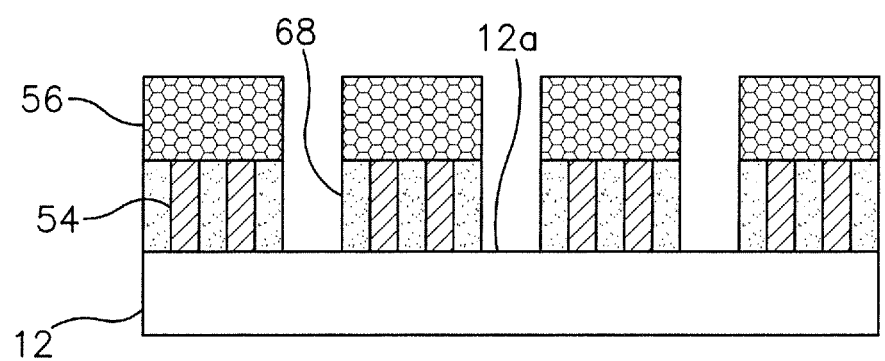
Figure 2:
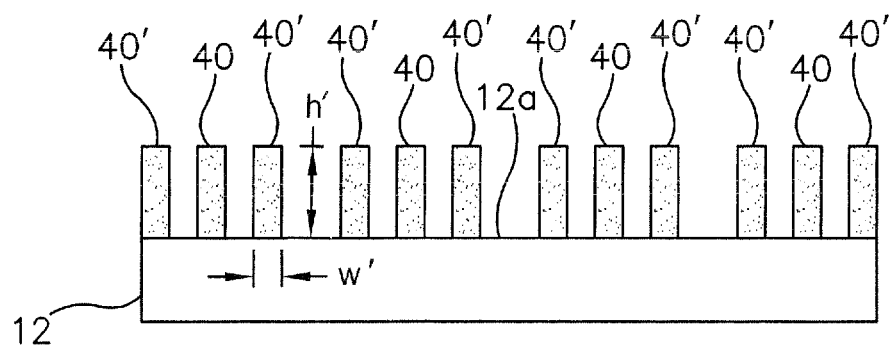

A further embodiment of the invention is depicted in FIG. 2. With reference to FIG. 2(A), a patterned stack 10' is provided. The patterned stack 10' can be formed using any suitable method (e.g., traditional lithography, development, and etching), including patterning methods disclosed herein to produce a first pattern in and/or on substrate surface 12a or intermediate layers that may be present on the substrate surface 12a (not shown). The pattern will include a plurality of initial features 40 formed on substrate surface 12a (or intermediate layers), which each have respective widths w and heights h. In FIG. 2(B), an undercuttable layer 44 is formed on the patterned stack 10', followed by an imaging layer 46, as described above. The average thickness of the undercuttable layer 44 (after baking) will preferably range from about 1 nm to about 100 nm, more preferably from about 10 nm to about 80 nm, and most preferably from about 20 nm to about 50 nm. The undercuttable layer 44 is preferably formed at an average thickness substantially equal to or slightly greater than the height h of the initial features 40 (e.g., ±30% of the height h of the initial features). The imaging layer 46 (after baking) will preferably have an average thickness ranging from about 1 nm to about 500 nm, more preferably from about 50 nm to about 300 nm, and most preferably from about 100 nm to about 200 nm.

As shown in FIG. 2(B), the imaging layer 46 can then be patterned by exposure to light of the appropriate wavelength using a mask 18 positioned above the imaging layer 46, followed by wet or dry etching as described above to transfer the pattern into the layers and laterally etch the undercuttable layer 44. This patterning process is preferably aligned with the initial pattern, and preferably, is carried out using a mask having narrower openings than the first pattern to maintain a regular pitch between the final features (discussed below). However, it will be appreciated that the specific geometry requirements will depend on the desired pitch and line dimensions. After pattern transfer, T-shaped structures 52 remain on surface 12a of substrate 12, or on any intermediate layers that are included on surface 12a, as shown in FIG. 2(C). T-shaped structures 52 each comprise an upright leg 54 and a generally horizontal section 56, and define undercut areas 53a, 53b.

Legs 54 comprise upper and lower portions 58, 60 joined by opposing vertical sidewalls 62a, 62b, which are generally parallel to one another. When the pattern is aligned with the initial features 40, legs 54 include a core 63 that is chemically identical to the initial features 40, while the outer portions of the legs 54 defined by sidewalls 62a, 62b, are chemically identical to the undercuttable layer 44 after baking, as shown in FIG. 2(C). Legs 54 are generally perpendicular to substrate surface 12a, with lower portion 60 contacting surface 12a, or any intermediate layers that may be present on surface 12a. That is, the angle A as measured from a vertical sidewall 62a or 62b to substrate surface 12a (or any intermediate layers, when present) is from about 70° to about 110° more preferably from about 80° to about 100°, and even more preferably from about 85° to about 95°.

Sections 56 are chemically identical to the non-exposed portions of imaging layer 46 after baking, and comprise respective upper and lower surfaces 64a, 64b and endwalls 66a, 66b. Sections 56 each have a length U, which is the greatest distance measured between endwalls 36a, 36b. U will preferably range from about 30 nm to about 1,000 nm, more preferably from about 50 nm to about 200 nm, and most preferably from about 65 nm to about 100 nm. Upper and lower surfaces 64a, 64b are generally parallel to one another and to surface 12a, while endwalls 66a, 66b are generally parallel to one another and to sidewalls 62a, 62b, while being generally perpendicular to surface 12a. Lower surface 64b of section 56 is adjacent upper portion 58 of leg 54. Upright legs 54 have a height H' that is defined by the maximum distance between the substrate surface 12a (or any intermediate layers, when present) and lower surface 64b. This height H' will generally correspond to the average thickness of the second undercuttable layer 44, described above, and will preferably range from about 1 nm to about 100 nm, more preferably from about 10 nm to about 80 nm, and most preferably from about 20 nm to about 50 nm.

Undercut area 53a has a width Wa', which is measured as the maximum distance between sidewall 62a and the plane defined by endwall 66a. Likewise, undercut area 53b has a width Wb', which is measured as the maximum distance between sidewall 62b and the plane defined by endwall 66b. Advantageously, this process allows Wa', Wb' to be controlled and made relatively small without losing any of the overall height of legs 54 during etching or other processing. The inventive process can result in a Wa' or Wb' of from about 1 nm to about 100 nm, preferably from about 1 nm to about 50 nm, and even more preferably from about 1 nm to about 20 nm. Preferably, Wa' or Wb' is from about 0.5% to about 49% of more preferably from about 10% to about 40% of L', and even more preferably from about 20% to about 35% of L.

As shown in FIG. 2(D), a selectively etchable composition 68 is coated onto the T-shaped structures 52, filling the undercut areas 53a, 53b. The selectively etchable composition 68 can be applied using any suitable method, with one preferred method being with one preferred method being spin-coating the composition at speeds of from about 100 rpm to about 5,000 rpm (preferably from about 500 rpm to about 3,000 rpm) for a time period of from about 15 seconds to about 90 seconds (preferably from about 30 seconds to about 60 seconds). After the selectively etchable composition 68 is applied, it is preferably heated to a temperature of from about 50° C. to about 300° C., and more preferably from about 80° C. to about 120° C. and for time periods of from about 15 seconds to about 90 seconds (preferably from about 30 seconds to about 60 seconds) to evaporate solvents. The selectively etchable composition 68 is preferably applied at an average thickness sufficient to fill the undercut areas 53a, 53b, such that the composition 68 contacts the sidewalls 62a, 62b, and optionally, lower surface 64b of the T-shaped structures 52. In some cases, the selectively etchable composition 68 will overcoat the T-shaped structures 52. The average thickness of the cured or dried selectively etchable composition 68 as measured over the substrate will preferably range from about 1 nm to about 1,000 nm, more preferably from about 1 nm to about 100 nm, and most preferably from about 1 nm to about 50 nm.

As shown in FIG. 2(E), the second selectively etchable composition 68 is then selectively removed using the T-shaped structures 52 as a mask, leaving the second selectively etchable composition 68 only in the undercut areas 53a, 53b. Preferably, RIE is used to selectively remove the second selectively etchable composition 68 using a reactive ion plasma of $CF_4$, $CHF_3$, $O_2$, $HBr$, $Cl_2$, $SF_6$, $C_2F_6$, $C_4F_8$, $CO$, $CO_2$, $N_2$, $H_2$, $C_4H_8$, $Ar$, $N_2H_2$, $He$, $CH_2F_2$, or a mixture thereof. Etching time will vary depending upon the materials used in the stack 10; however, it will generally range from about 1 to about 120 seconds, preferably from about 15 to about 90 seconds, and even more preferably from about 30 to about 60 seconds.

As shown in FIG. 2(F), the second imaging layer 46 (i.e., section 56) and second undercuttable layer 44 (i.e. leg portions 54) are then removed, as described above, leaving behind the initial features 40 that were previously formed on the substrate surface 12a or intermediate layers (when present), as well as a plurality of undercut-formed features 40'. The undercut-formed features 40' are chemically identical to the selectively etchable composition 68 (after drying or curing) that was deposited into undercut areas 53a, 53b. The undercut-formed features 40' will each have a width w' that substantially corresponds to the width Wa', Wb' of undercut areas 53a, 53b. More specifically, the width w' of the undercut-formed features 40' will preferably range from about 1 nm to about 100 nm, more preferably from about 5 nm to about 30 nm, and most preferably from about 10 nm to about 20 nm. The height h' of the undercut-formed features 40' will substantially correspond to the height H' of the upright leg 54. More specifically, the height h' of the undercut-formed features 40' will preferably range from about 1 nm to about 100 nm, more preferably from about 20 nm to about 60 nm, and most preferably from about 30 nm to about 50 nm. It will be appreciated that the height h' of the second undercut-formed features 40' can be adjusted by adjusting the thickness of the undercuttable layer 44, while the width w' can be controlled by adjusting the amount of undercut and/or etching process used. The pitch of the undercut-formed features can be changed by adjusting the linewidth of the pattern, or by using a multiple-patterning approach, such as one described herein.

Figure 3A:
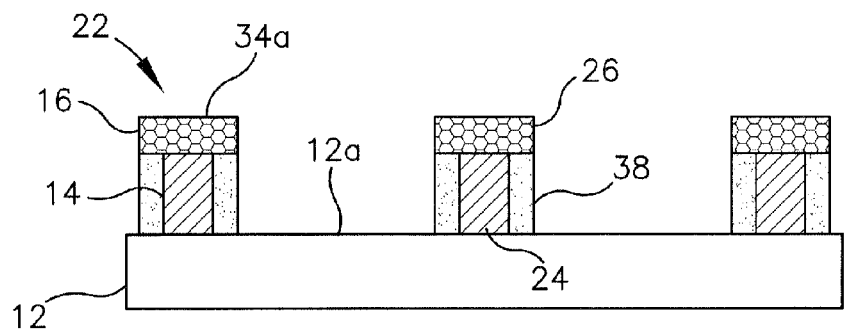
FIGS. 3(A)-(F) illustrate a schematic cross-section of a process of forming a microelectronic structure according to an alternative embodiment of the invention.
Figure 3B:
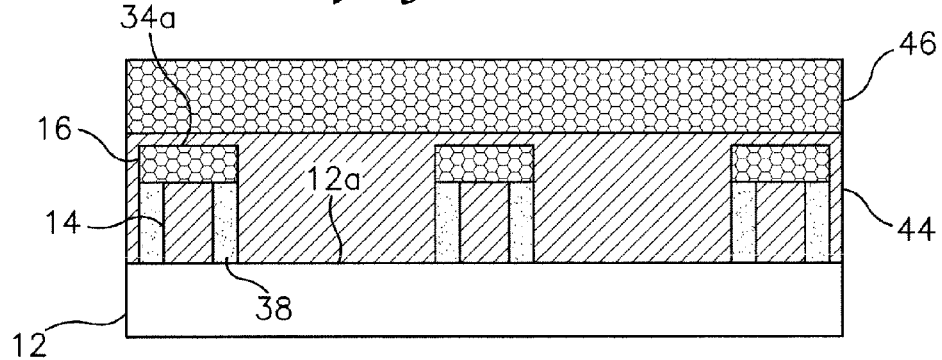
Figure 3C:
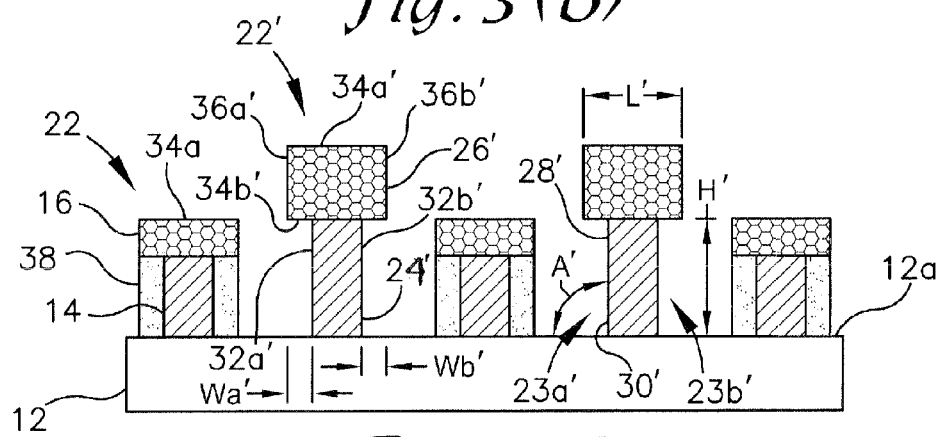
Figure 3D:
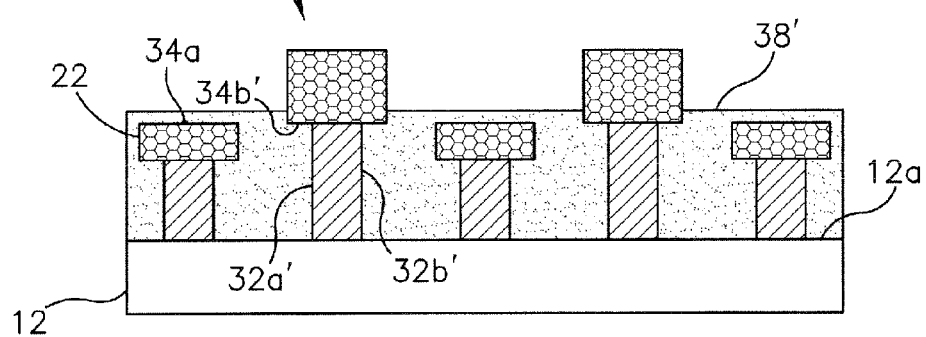
Figure 3:
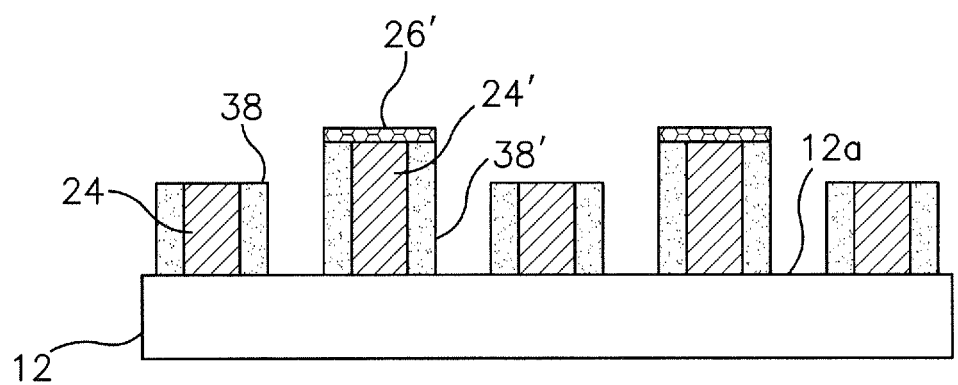
Figure 3:
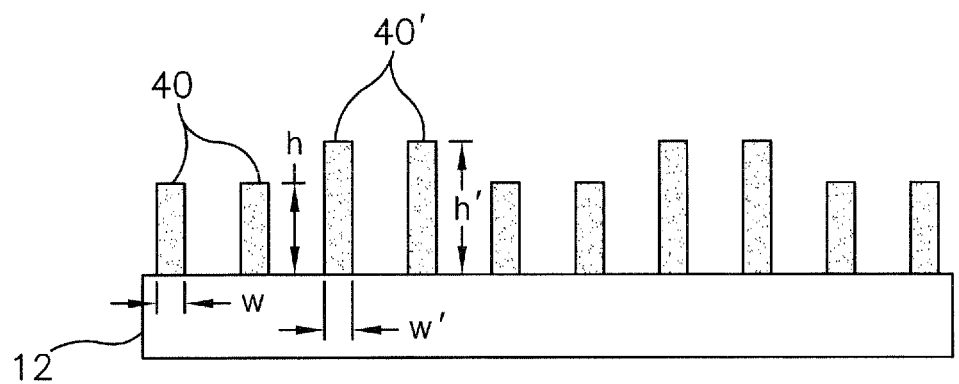

FIG. 3 illustrates a further embodiment of the invention. With reference to FIG. 3(A), a first plurality of T-shaped structures 22 with filled undercut areas 23a, 23b are formed on a substrate surface 12a or intermediate layers that may be present (now shown), as described with respect to FIGS. 1(A)-(D) above. However, the first undercuttable layer 14 and first imaging layer 16 remain on the substrate 12 along with the first selectively etchable composition 38. A second undercuttable layer 44 is formed on the stack 10, followed by a second imaging layer 46, as described above. Preferably, the second undercuttable layer 44 is formed at an average thickness sufficient to overcoat the first plurality of f-shaped structures 22. More particularly, the average thickness of the second undercuttable layer 44, as measured above the tops of the highest feature after baking, will preferably range from about 1 nm to about 100 nm, more preferably from about 10 nm to about 80 nm, and most preferably from about 20 nm to about 50 nm. The imaging layer 46 (after baking) will preferably have an average thickness ranging from about 1 nm to about 500 nm, more preferably from about 50 nm to about 300 nm, and most preferably from about 100 nm to about 200 nm. It will be appreciated that the second undercuttable layer 44 and second imaging layer 46 could be formed from the same or different materials as the first undercuttable layer 14 and first imaging layer 16, depending on the desired topography.

The second imaging layer 46 and undercuttable layer 44 are then patterned as described above to produce a second plurality of T-shaped structures 22', as shown in FIG. 3(C). T-shaped structures 22' each comprise an upright leg 24' and a generally horizontal section 26', and define undercut areas 23a', 23b'. Legs 24' are chemically identical to the second undercuttable layer 44 after baking, and comprise upper and lower portions 28', 30' joined by opposing vertical sidewalls 32a', 32b'. Sidewalls 32a', 32b' are generally parallel to one another, and are also generally perpendicular to substrate surface 12a, with lower portion 30' contacting surface 12a, or any intermediate layers that may be present on surface 12a. That is, the angle A' formed by a vertical sidewall 32a' or 32b' and substrate surface 12a (or any intermediate layers, when present) is from about 70° to about 110°, more preferably from about 80° to about 100°, and even more preferably from about 85° to about 95°.

Sections 26' are chemically identical to non-exposed portions of the second imaging layer 46 after baking, and comprise respective upper and lower surfaces 34a', 34b' and endwalls 36a', 36b'. Upper and lower surfaces 34a', 34b' are generally parallel to one another and to surface 12a, while endwalls 36a', 36b' are generally parallel to one another and to sidewalls 32a', 32b', while being generally perpendicular to surface 12a. Section 32' has a length L', which is the greatest distance measured between endwalls 36a', 36b'. L' will preferably range from about 10 nm to about 1,000 nm, more preferably from about 20 nm to about 100 nm, and most preferably from about 38 nm to about 45 nm. Lower surface 34b' of section 26' is adjacent upper portion 28' of leg 24'. Upright legs 24' have a height H' that is defined by the maximum distance between the substrate surface 12a (or any intermediate layers, when present) and lower surface 34b. This height H' will generally correspond to the average thickness of the second undercuttable layer 44, described above, and is preferably greater than the height H of the upright leg 24 of the first plurality of T-shaped structures 22. More preferably, the leg height H' of the second plurality of T-shaped structures will range from about 1 nm to about 150 nm, more preferably from about 20 nm to about 80 nm, and most preferably from about 30 nm to about 60 nm.

Undercut area 23a' has a width Wa', which is measured as the maximum distance between sidewall 32a' and the plane defined by endwall 36a'. Likewise, undercut area 23b' has a width Wb', which is measured as the maximum distance between sidewall 32b' and the plane defined by endwall 36b'. Advantageously, this process allows Wa' or Wb' to be controlled and made relatively small without losing any of the overall height of legs 44 during etching or other processing. The inventive process can result in a Wa' or Wb' of from about 1 nm to about 100 nm, preferably from about 1 nm to about 50 nm, and even more preferably from about 1 nm to about 20 nm. Preferably, Wa' or Wb' is from about 0.5% to about 49% of L', more preferably from about 10% to about 40% of L', and even more preferably from about 20% to about 35% of L'.

As shown in FIG. 3(D), a second selectively etchable composition 38' is coated onto the patterned stack 10' comprising the first and second plurality of T-shaped structures 22, 22', filling the undercut areas 23a', 23b' of the second plurality of T-shaped structures 22'. The second selectively etchable composition 38' can be applied using any suitable method, as described above. The second selectively etchable composition 38' is preferably applied at an average thickness sufficient to overcoat the first plurality of T-shaped structures 22, without overcoating the second plurality of T-shaped structures 22'. More particularly, the average thickness of the second selectively etchable composition 38', as measured over the tops of the highest features (i.e., first plurality of T-shaped structures) after baking, will preferably range from about 1 nm to about 100 nm, more preferably from about 10 nm to about 80 nm, and most preferably from about 20 nm to about 50 nm.

As shown in FIG. 3(E), the second selectively etchable composition 38' is then selectively removed using the first and second T-shaped structures 22, 22' as a mask, leaving the first and second etchable compositions 38, 38' only in the undercut areas. As shown in FIG. 3(F), the first and second imaging layers 16, 46 (i.e., generally horizontal sections 26 and 26') and first and second undercuttable layers 14, 44 (i.e., upright legs 24 and 24') are then removed, as described herein, leaving behind a first plurality of undercut-formed features 40, and a second plurality of undercut-formed features 40'. The first plurality of undercut-formed features 40 are chemically identical to the selectively etchable composition 38 that was deposited into undercut areas 23a, 23b. The second plurality of undercut-formed features 40' are chemically identical to the selectively etchable composition 38' that was deposited into undercut areas 23a', 23b'.

Figure 1:
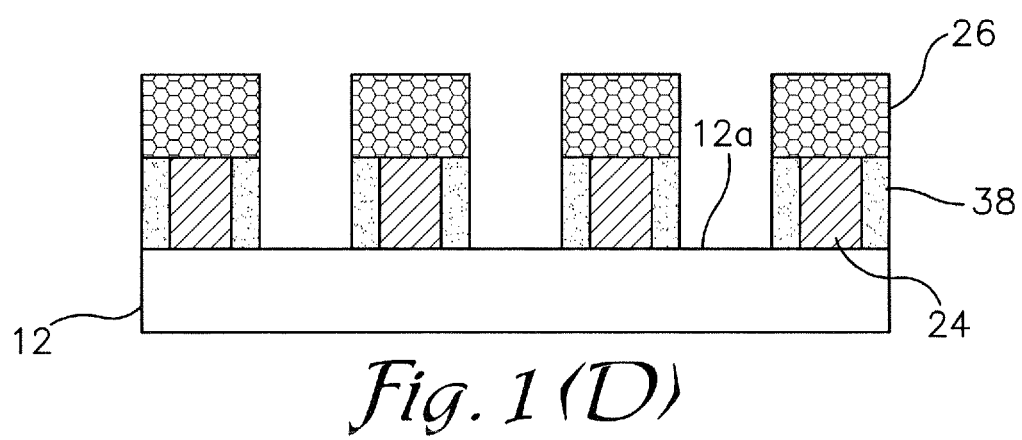
Figure 1:
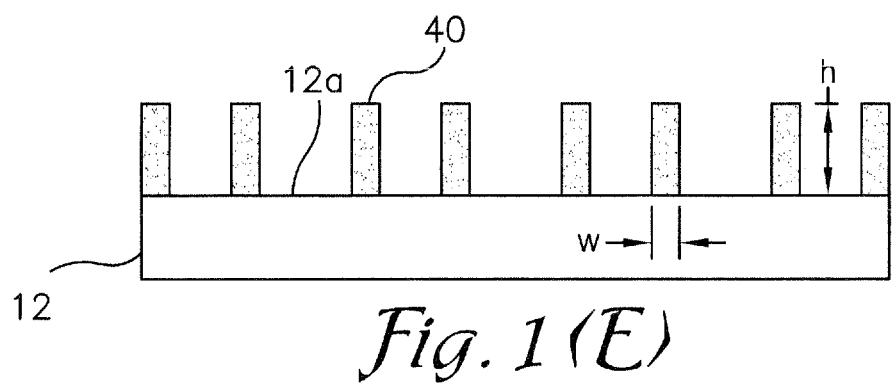

The first undercut-formed features 40 will each have a width w that substantially corresponds to the width Wa, Wb of undercut areas 23a, 23b, as described above with respect to FIG. 1. The height h of the first undercut-formed features 40 will substantially correspond to the height H of the upright leg 24, as described above with respect to FIG. 1. The second undercut-formed features 40' will each have a width w' that substantially corresponds to the width Wa', Wb' of undercut areas 23a', 23b'. More specifically, the width w' of the second undercut-formed features 40' will preferably range from about 1 nm to about 100 nm, more preferably from about 1 nm to about 50 nm, and most preferably from about 1 nm to about 20 nm. The height h' of the second undercut-formed features 40' will substantially correspond to the height H' of the upright leg 24'. More specifically, the height h' of the second undercut-formed features 40' will preferably range from about 1 nm to about 100 nm, more preferably from about 10 nm to about 80 nm, and most preferably from about 20 nm to about 50 nm. The ratio of w':h' will preferably be from about 1:10 to about 10:1, more preferably from about 1:1 to about 1:5, and even more preferably from about 1:1 to about 1:3. It will be appreciated that the height of the final undercut-formed features 40, 40' can be adjusted by adjusting the thickness of the undercuttable layers 14, 44 while the width can be controlled by adjusting the amount of undercut and/or etch process used.

Figure 4:
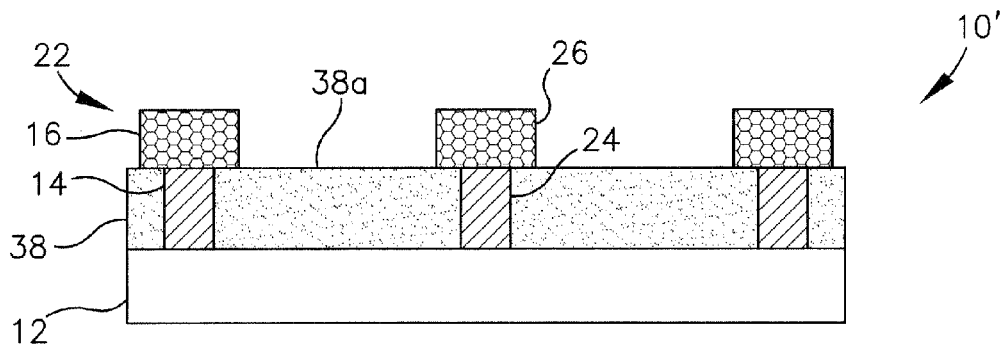
FIGS. 4(A)-(G) illustrate a schematic cross-section of a process of forming a microelectronic structure according to a further embodiment of the invention.
Figure 4:
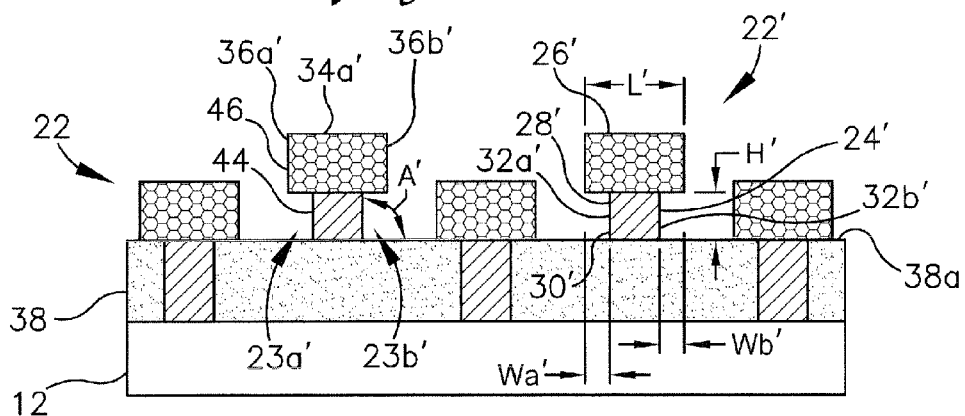
Figure 4:
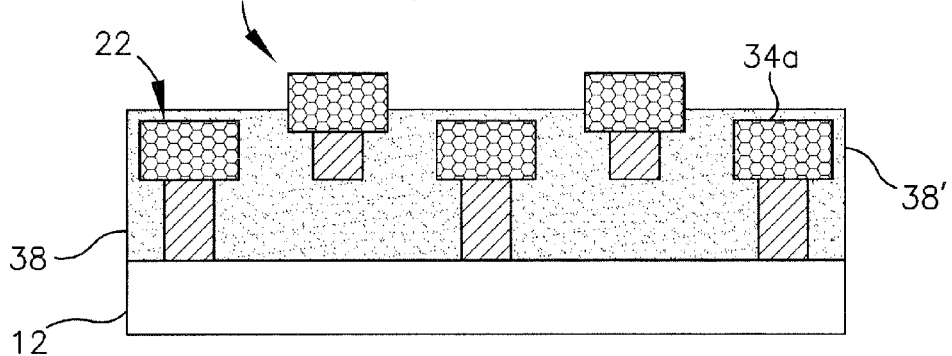
Figure 4:
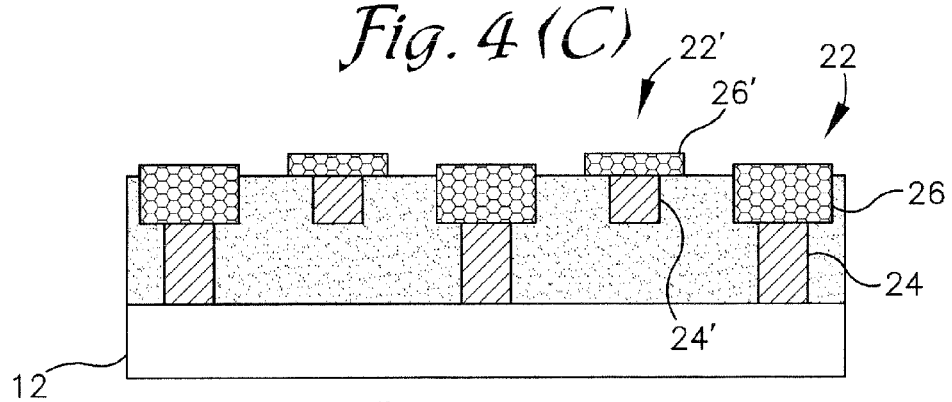
Figure 4:
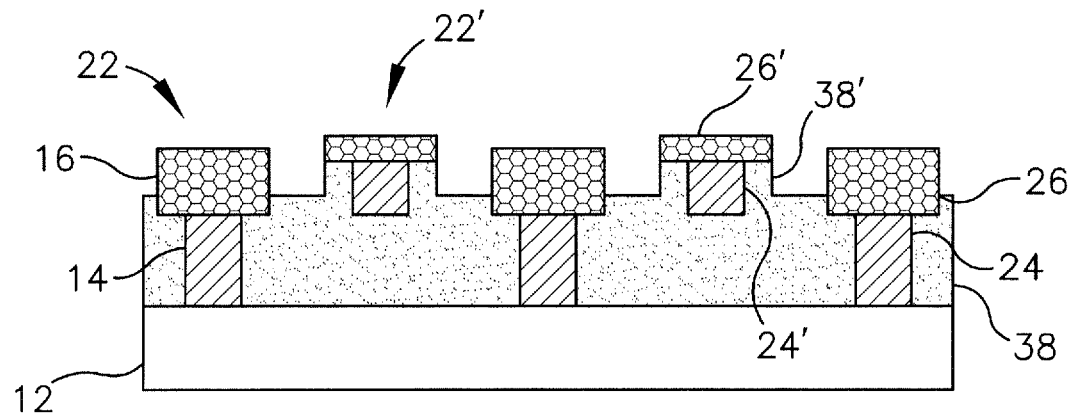
Figure 4:
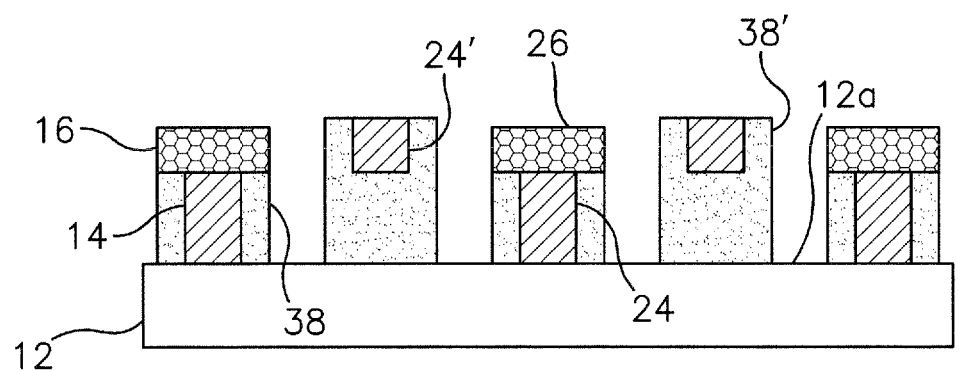
Figure 4:
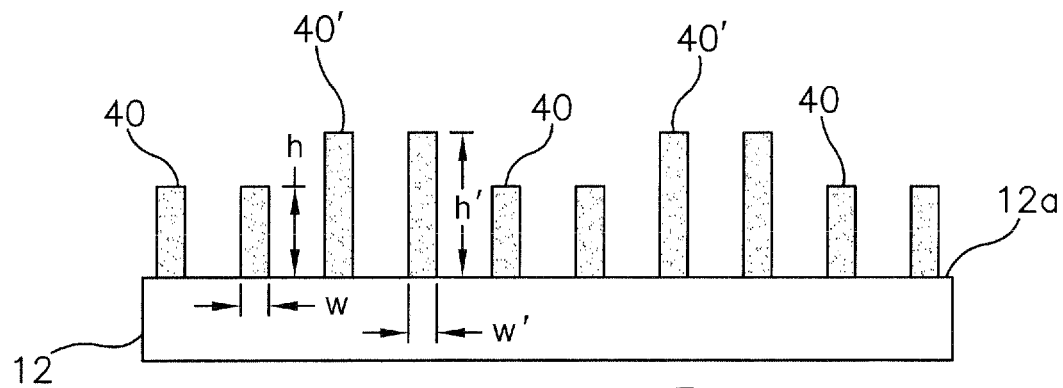

A further alternative embodiment is depicted in FIG. 4. A first imaging layer 16 and a first undercuttable layer 14 have been patterned to yield a first plurality of T-shaped structures 22 having undercut areas, as described above with respect to FIG. 1. As shown in FIG. 4(A), a first selectively etchable composition 38 was then deposited onto the patterned stack 10'. The first selectively etchable composition 38 was applied at an average thickness sufficient to fill the undercut areas 23a, 23b and cover the substrate surface 12a, without overcoating the first T-shaped structures 22. Preferably, the first selectively etchable composition 38 is applied at an average thickness substantially equal to the average thickness of the first undercuttable layer 14 (in other words, substantially equal to the height of the leg 24 of the first T-shaped structure 22), as depicted in FIG. 4(A), so that it contacts the sidewalls 32a, 32b, and optionally, lower surface 34b of the first T-shaped structures 22. The average thickness of the first selectively etchable composition 38 will preferably range from about 1 nm to about 100 nm, more preferably from about 20 nm to about 60 nm, and most preferably from about 30 nm to about 50 nm.

A second plurality of T-shaped structures 22' are then formed on the first selectively etchable composition 38, as shown in FIG. 4(B). To form the second plurality of T-shaped structures 22', a second undercuttable layer 44 and second imaging layer 46 were formed on the stack 10' (not shown). The second undercuttable layer 44 is preferably formed at an average thickness substantially equal to the average thickness of the first imaging layer 16 (in other words, substantially equal to the average thickness of the generally horizontal portion 26 of the first I-shaped structure 22). The average thickness of the second undercuttable layer 44 will preferably range from about 1 nm to about 100 nm, more preferably from about 20 nm to about 60 nm, and most preferably from about 30 nm to about 50 nm. It will be appreciated that the second undercuttable layer 44 and second imaging layer 46 could be formed from the same or different materials as the undercuttable layer 14 and imaging layer 16 used to form the first plurality of T-shaped structures 22, depending on the desired topography. The average thickness of the second imaging layer 46 will preferably range from about 1 nm to about 500 nm, more preferably from about 50 nm to about 300 nm, and most preferably from about 100 nm to about 200 nm. The second imaging layer 46 and undercuttable layer 44 are then patterned as described above to produce the second plurality of T-shaped structures 22°.

The second plurality of T-shaped structures 22' each comprise an upright leg 24' and a generally horizontal section 26', and define undercut areas 23a', 23b'. Legs 24' are chemically identical to the second undercuttable layer 44 after baking, and comprise upper and lower portions 28', 30' joined by opposing vertical sidewalls 32a', 32b'. Sidewalls 32a', 32b' are generally parallel to one another, and are also generally perpendicular to surface 38a, with lower portion 30' contacting the surface 38a of the first selectively etchable layer 38. That is, the angle A' formed by a vertical sidewall 32a' or 32b' and surface 38a is from about 70° to about 110', more preferably from about 80° to about 100', and even more preferably from about 85' to about 95°.

As shown in FIG. 4(B), sections 26' are chemically identical to non-exposed portions of the second imaging layer 46 after baking, and comprise respective upper and lower surfaces 34a', 34b' and endwalls 36a', 36b'. Section 32' has a length L', which is the greatest distance measured between endwalls 36a', 36b'. L' will preferably range from about 10 nm to about 1,000 nm, more preferably from about 20 nm to about 100 nm, and most preferably from about 38 nm to about 45 nm. Upper and lower surfaces 34a', 34b' are generally parallel to one another and to surface 38a, while endwalls 36a', 36b' are generally parallel to one another and to sidewalls 32a', 32b', while being generally perpendicular to surface 38a. Lower surface 34b' of section 26' is adjacent upper portion 28' of leg 24'. Upright legs 24' have a height H' that is defined by the maximum distance between surface 38a and lower surface 34b'. This height H' will generally correspond to the average thickness of the second undercuttable layer 44. More preferably, the leg height H' of the second plurality of T-shaped structures 22' will range from about 1 nm to about 500 nm, more preferably from about 50 nm to about 200 nm, and most preferably from about 100 nm to about 200 nm.

Undercut area 23a' has a width Wa', which is measured as the maximum distance between sidewall 32a' and the plane defined by endwall 36a'. Likewise, undercut area 23b' has a width Wb', which is measured as the maximum distance between sidewall 32b' and the plane defined by endwall 36b'. Advantageously, this process allows the width Wa', Wb' to be controlled and made relatively small without losing any of the overall height of legs 24' during etching or other processing. The inventive process can result in a Wa' or Wb' of from about 1 nm to about 100 nm, preferably from about 1 nm to about 50 nm, and even more preferably from about 1 nm to about 20 nm. Preferably, Wa' or Wb' is from about 0.5% to about 49% of L', more preferably from about 10% to about 40% of L', and even more preferably from about 20% to about 35% of L'.

As shown in FIG. 4(C), a second selectively etchable composition 38' is then applied to the stack 10' filling the undercut areas 23a', 23h'. As shown in FIGS. 4(D)-(F), the first and second selectively etchable compositions 38, 38' are selectively removed using the first and second T-shaped structures 22, 22' as a mask, leaving the first and second etchable composition 38, 38' only in the undercut areas and beneath the second plurality of T-shaped structures 22'. A series of etching and/or developing steps can then be used to remove the first and second undercuttable layers 14, 44 and first and second imaging layer 16, 46, as well as remaining portions of the first selectively etchable composition 38 underneath the upright leg 24' of the second plurality of T-shaped structures 22' to leave behind a first plurality of undercut-formed features 40, and a second plurality of undercut-formed features 40', as shown in FIG. 4(G). The first plurality of undercut-formed features 40 are identical to the first selectively etchable composition 38 that was deposited into undercut areas 23a, 23b. The second plurality of undercut-formed features 40' are identical to the second selectively etchable composition 38' that was deposited into undercut areas 23a', 23b'.

The first undercut-formed features 40 will each have a width w that substantially corresponds to the width Wa, Wb of undercut areas 23a, 23b, as described above with respect to FIG. 1. The height h of the first undercut-farmed features 40 will substantially correspond to the height H of the upright leg 24, as described above with respect to FIG. 1. The second undercut-formed features 40' will each have a width w' that substantially corresponds to the width Wa', Wb' of undercut areas 23a', 23b'. More specifically, the width w' of the undercut-formed features 40' will preferably range from about 1 nm to about 100 nm, more preferably from about 1 nm to about 50 nm, and most preferably from about 1 nm to about 20 nm. The height h' of the second undercut-formed features 40' will substantially correspond to the combined average thickness of the first selectively etchable composition 38 and second undercuttable layer 44 (in other words, substantially equal to the average thickness of the first selectively etchable composition 38 plus the height of the upright leg 24' of the second plurality of T-shaped structures 22'). More specifically, the height h' of the second undercut-formed features 40' will preferably range from about 1 nm to about 100 nm, more preferably from about 20 nm to about 60 nm, and most preferably from about 30 nm to about 50 nm. The ratio of w':h' will preferably range from about 10:1 to about 1:10, more preferably from about 1:1 to about 1:5, and even more preferably from about 1:1 to about 1:3. It will be appreciated that the height of the final undercut-formed features 40, 40' can be adjusted by adjusting the thickness of the undercuttable layers 14, 44, while the width can be controlled by adjusting the amount of undercutting and/or the etch process used.

A further embodiment of the invention is depicted in FIG. 5. With reference to FIG. 5(A), T-shaped structures 22 with filled undercut areas are first formed on a substrate surface 12*a* as described above for FIGS. 1(A)-(D), or intermediate layers that may be present (not shown). A first conformal layer 70 is formed over the T-shaped structure 22, as shown in FIG. 5(A). The first conformal layer 70 can be applied using any suitable method, including chemical vapor deposition (CVD), plasma enhanced CVD (PECVD), physical vapor deposition, atomic layer deposition, or spin-coating. The average thickness of the first conformal layer over the substrate is preferably from about 1 nm to about 100 nm, more preferably from about 1 nm to about 50 nm, and even more preferably from about 1 nm to about 20 nm. The first conformal layer 70 is preferably applied at an average thickness sufficient to substantially cover and evenly coat the upper surfaces 34*a* of the T-shaped structures 22 as well as endwalls 36*a*, 36*b*, and to achieve the above average thicknesses over the topography of the structures. Thus, as depicted in FIG. 5(A), the first conformal layer 70 will have generally horizontal portions 70*a* running substantially parallel to substrate surface 12*a*, as well as generally vertical portions 70*b* running substantially parallel to endwalls 36*a*, 36*b*. It will be appreciated that the generally horizontal portions 70*a* will be adjacent substrate surface 12*a* and upper surface 34*a* of the T-shaped structures 22, while the generally vertical portions 70*b* will be adjacent the endwalls 36*a*, 36*b* of the T-shaped structures 22 and filled undercut areas 23*a*, 23*b*.

Figure 5A:
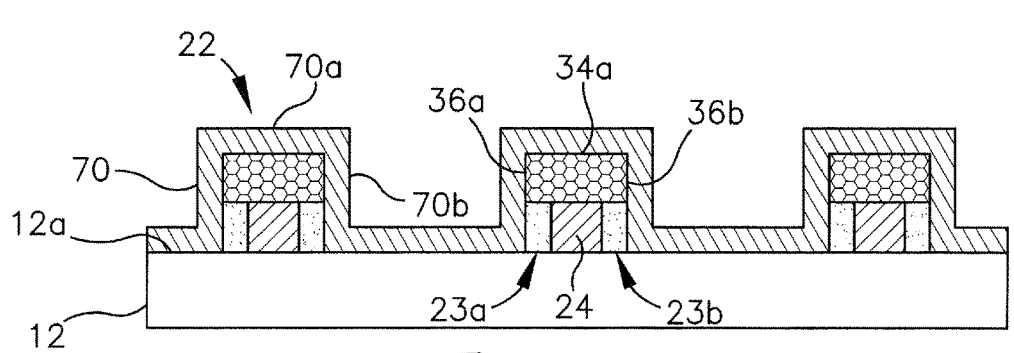
FIGS. 5(A)-(E) illustrate a schematic cross-section of a process of forming a microelectronic structure according to another embodiment of the invention.
Figure 5B:
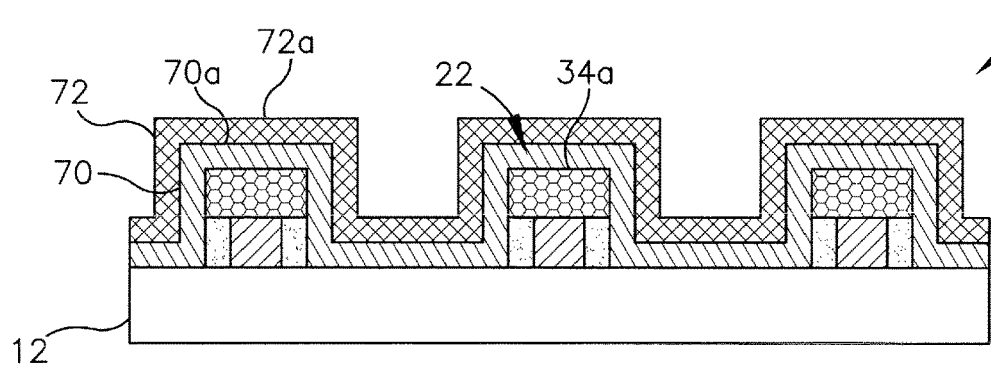

A second conformal layer 72 is then formed adjacent the first conformal layer 71, as shown in FIG. 5(B). The second conformal layer 72 is preferably formed of a different material from the first conformal layer 70. Suitable compositions for use in forming the conformal layers are discussed in more detail below. The second conformal layer 72 can be applied using any suitable method, including CVD, PECVD, physical vapor deposition, atomic layer deposition, or spin-coating. The average thickness of the second conformal layer 72 over the stack is preferably from about 1 nm to about 100 nm, more preferably from about 1 nm to about 50 nm, and even more preferably from about 1 nm to about 20 nm. The second conformal layer 72 is preferably applied at an average thickness sufficient to substantially cover and evenly coat the topography of the first conformal layer 70 and to achieve the above average thicknesses over this topography. Thus, as depicted in FIG. 5(B), the second conformal layer 72 will have generally horizontal portions 72*a* adjacent to the generally horizontal portions 70*a* of the first conformal layer 70, as well as generally vertical portions 72*b* adjacent the generally vertical portions 70*b* of the first conformal layer 70.

Figure 5C:
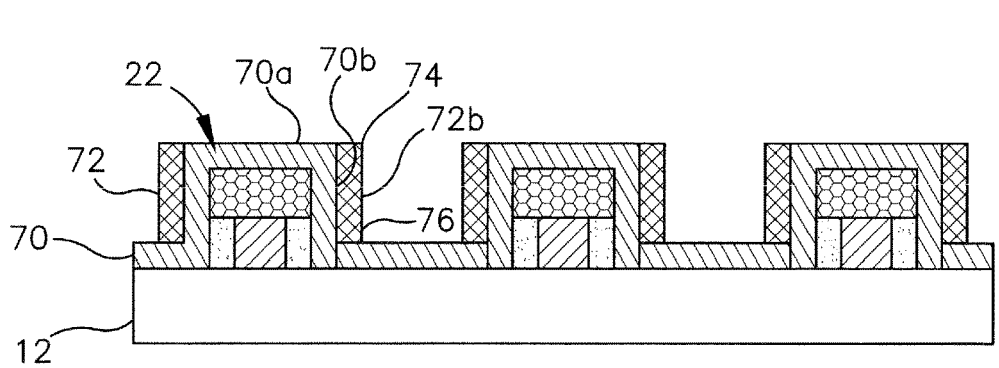
Figure 5D:
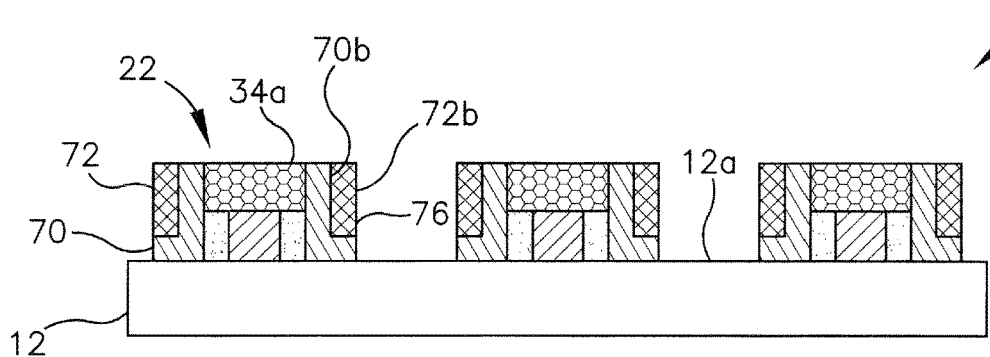

As shown in FIG. 5(C), the stack 10' is subjected to a first etching to remove portions of the second conformal layer 72 uncovering portions of the first conformal layer 70. Etching can be carried out using a reactive ion plasma of $CF_4$, $CHF_3$, $O_2$, HBr, $Cl_2$, $SF_6$, $C_2F_6$, $C_4F_8$, CO, $CO_2$, $N_2$, $H_2$, $C_4H_8$, Ar, $N_2H_2$, He, $CH_2F_2$, or a mixture thereof. Etching time will vary depending upon the second conformal layer 72; however, it will generally range from about 1 to about 120 seconds, preferably from about 15 to about 90 seconds, and even more preferably from about 30 to about 60 seconds. Preferably, etching is carried out to remove the substantially horizontal portions 72*a* of the second conformal layer 72, while leaving the generally vertical portions 72*b* on the stack 10'. The remaining generally vertical portions 72*b* have upper 74 and lower 76 portions. As shown in FIG. 5(D), the stack 10' is subjected to a second etching to remove the uncovered portions of the first conformal layer 70, in an amount substantially equal to the average thickness of the first conformal layer 70 to uncover the upper surface 34*a* of the T-shaped structures 22, as well as substrate surface 12*a*. Etching is preferably carried out for a time period of from about 1 to about 120 seconds, preferably from about 15 to about 90 seconds, and even more preferably from about 30 to about 60 seconds. Any of the foregoing etch gases may be used; however, the second etching preferably uses different etchants from the first etching. The second etching results in removal of the upper portions 74 of the generally vertical portions 72*b* of the second conformal layer 72.

Figure 5E:
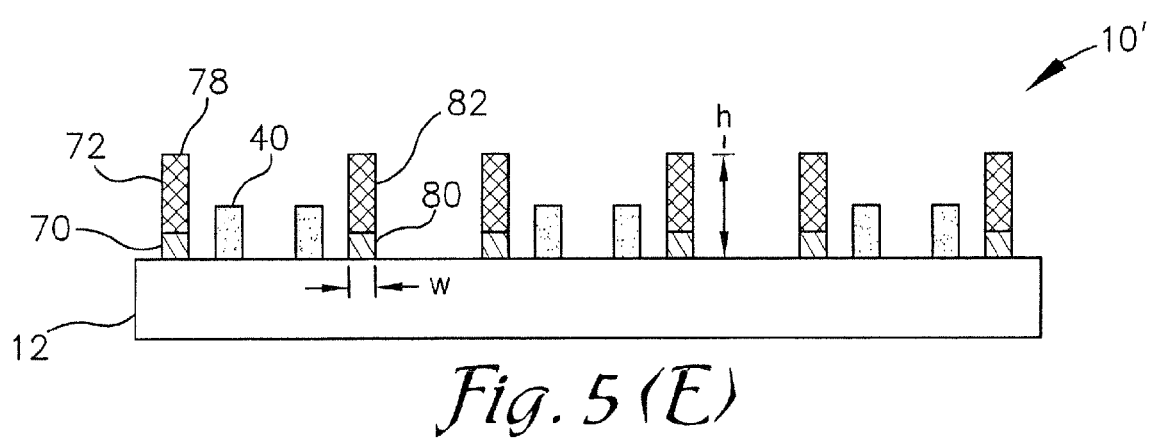

As shown in FIG. 5(E), the stack 10' is subjected to a third etching to remove the T-shaped structures 22, as well as the vertical portions 70*b* of the first conformal layer 70. Etching is preferably carried out for a time period of from about 1 to about 120 seconds, preferably from about 15 to about 90 seconds, and even more preferably from about 30 to about 60 seconds. Any of the foregoing etch gases may be used; however, the third etching preferably uses different etchants from the first or second etchings. After the third etching, the undercut-formed features 40 remain on the substrate surface, along with conformally-formed features 78. The conformally-formed features 78 have lower 80 and upper 82 portions and are chemically identical to the first conformal layer 70, and second conformal layer 72, respectively. The lower portions 80 are adjacent the substrate surface 12*a* or any intermediate layers that may be present, while the upper portions 82 are adjacent the lower portions 80 of the conformally-formed features 78. The conformally-formed features 78 will each have a width w that substantially corresponds to the average thickness of the vertical portions 72*b* of the second conformal layer 72. More specifically, the width w of the conformally-formed features 78 will preferably range from about 1 nm to about 100 nm, more preferably from about 1 nm to about 50 nm, and most preferably from about 1 nm to about 20 nm. The height h of the conformally-formed features 78 will preferably range from about 1 nm to about 150 nm, more preferably from about 20 nm to about 80 nm, and most preferably from about 30 nm to about 60 nm. It will be appreciated that the height h and width w of the conformally-formed features 78 can be controlled by varying the average thickness of the conformal layers 70, 72, as well as the amount of etching carried out on the stack 10'.

Figure 6:
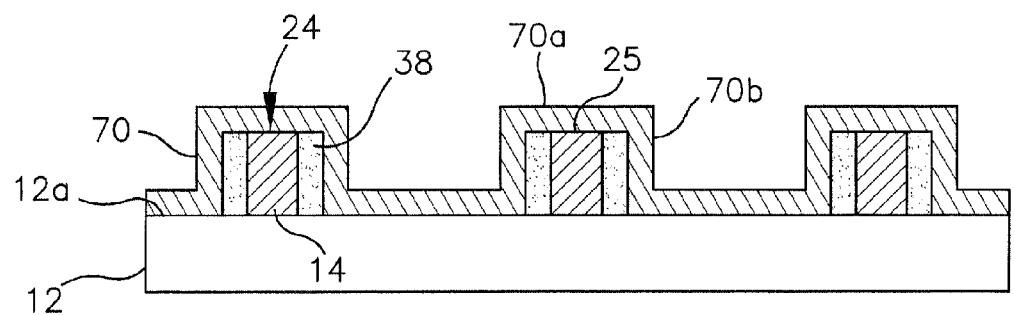
FIGS. 6(A)-(D) illustrate a schematic cross-section of a process of forming a microelectronic structure according to an alternative embodiment of the invention.
Figure 6:
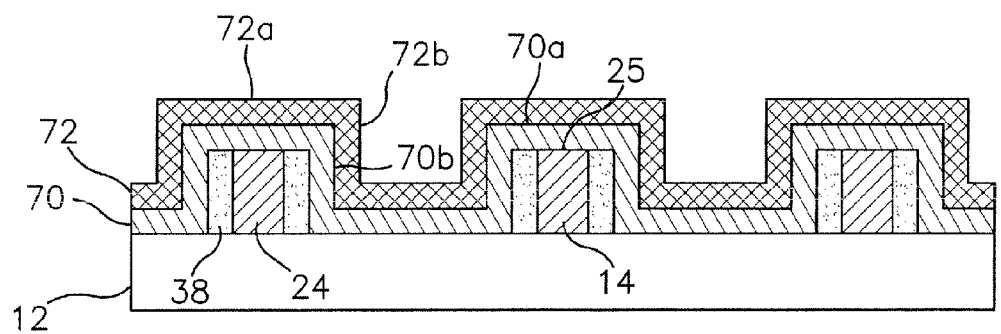
Figure 6:
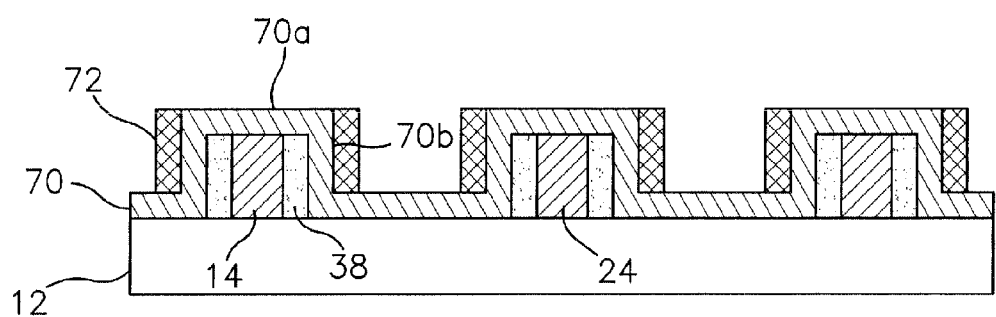
Figure 6:
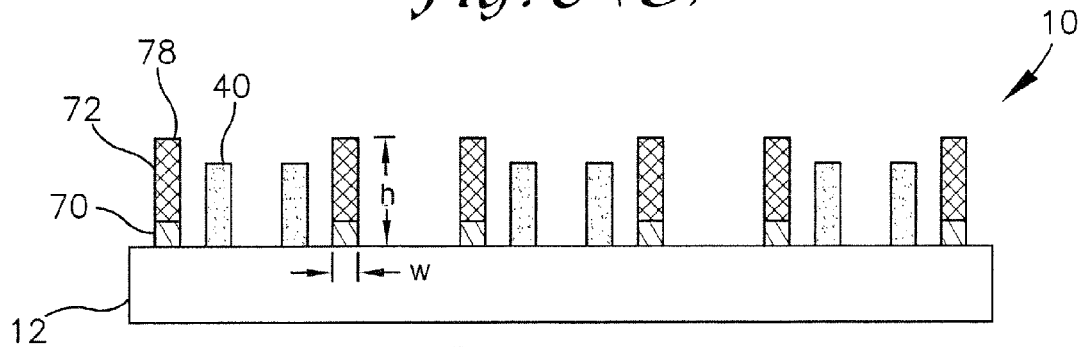

FIG. 6 illustrates a further embodiment of the invention. T-shaped structures 22 with filled undercut areas are first formed on a substrate surface 12*a*, as described above for FIGS. 1(A)-(D), or any intermediate layers that may be present. This method is similar to the process described above for FIG. 5, except that before deposition of the conformal layers, the imaging layer 16 is removed, leaving behind the undercuttable layer 14 (upright leg 24), and selectively etchable material 38 that was deposited into the undercut areas 23*a*, 23*b*. With reference to FIG. 6(A), a first conformal layer 70 is formed over the upright leg 24 and selectively etchable material 38. The first conformal layer 70 can be applied using any suitable method, including those described above regarding FIG. 5. The average thickness of the first conformal layer 70 over the substrate is preferably from about 1 nm to about 100 nm, more preferably from about 1 nm to about 50 nm, and even more preferably from about 1 nm to about 20 nm. The first conformal layer 70 is preferably applied at an average thickness sufficient to substantially cover and evenly coat the upright leg 24 and selectively etchable material 38 and to achieve the above average thicknesses over these structures. Thus, as depicted in FIG. 6(A), the first conformal layer 70 will have generally horizontal portions 70a running substantially parallel to substrate surface 12a, as well as generally vertical portions 70b running substantially parallel to upright leg 24. It will be appreciated that the generally horizontal portions 70a will be adjacent substrate surface 12a and upper surfaces 25 of upright legs 24 and selectively etchable material 38, while the generally vertical portions 70b will be adjacent the sidewalls of the selectively etchable material 38. A second conformal layer 72 is then formed adjacent the first conformal layer 71, as shown in FIG. 6(B). The second conformal layer 72 is preferably formed of a different material from the first conformal layer 70. The second conformal layer 72 can be applied using any suitable method, such as those described above for FIG. 5. The average thickness of the second conformal layer 72 is preferably from about 1 nm to about 100 nm, more preferably from about 1 nm to about 50 nm, and even more preferably from about 1 nm to about 20 nm. The second conformal layer 72 is preferably applied at an average thickness sufficient to substantially cover and evenly coat the topography of the first conformal layer 70 and to achieve the above average thicknesses over this topography. Thus, as depicted in FIG. 6(B), the second conformal layer 72 will have generally horizontal portions 72a adjacent to the generally horizontal portions 70a of the first conformal layer 70, as well as generally vertical portions 72b adjacent the generally vertical portions 70b of the first conformal layer 70.

As shown in FIG. 6(C), the stack 10' is subjected to a first etching to remove the substantially horizontal portions 72a of the second conformal layer 72, and uncover the generally horizontal portions of the first conformal layer 70. As shown in FIG. 6(D), the stack 10 is subjected to a second and third etching to remove the undercuttable layer 14 (i.e., upright leg 24) and portions of the first conformal layer 70 not protected by the second conformal layer 72 (i.e., using the second conformal layer 72 as an etch mask). This process yields features comprising the undercut-formed features 40, which correspond to the selectively etchable material 38 that was initially deposited into the undercut areas 23a, 23b, as well as conformally-formed features 78, which correspond to the remaining portions of the second conformal layer 72, and portions of the first conformal layer 70 directly below the remaining second conformal layer 72. The conformally-formed features 78 will each have a width w that substantially corresponds to the average thickness of the vertical portions 72b of the second conformal layer 72. More specifically, the width w of the conformally-formed features 78 will preferably range from about 1 nm to about 100 nm, more preferably from about 1 nm to about 50 nm, and most preferably from about 1 nm to about 20 nm. The height h of the conformally-formed features 78 will preferably range from about 1 nm to about 150 nm, more preferably from about 20 nm to about 80 nm, and most preferably from about 30 nm to about 60 nm. It will be appreciated that the height h and width w of the conformally-formed features 78 can be controlled by varying the thickness of the conformal layers 70, 72, as well as the amount of etching carried out on the stack 10'.

Figure 7:
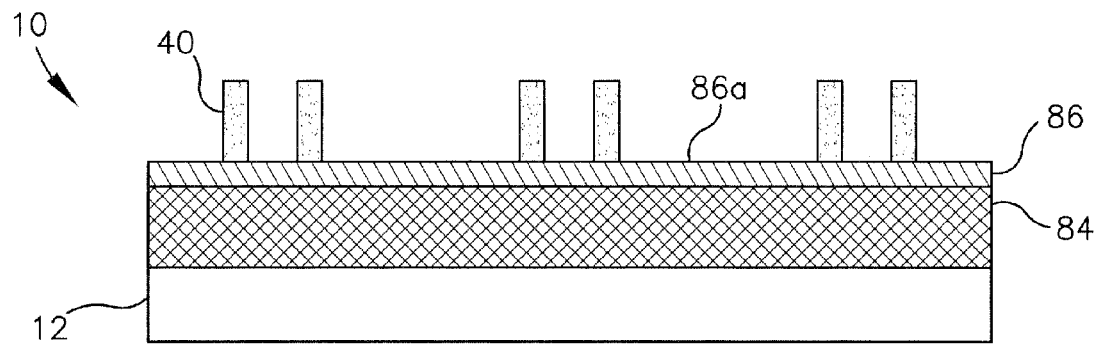
FIGS. 7(A)-(F) illustrate a schematic cross-section of a process of forming a microelectronic structure according to further embodiment of the invention.
Figure 7:
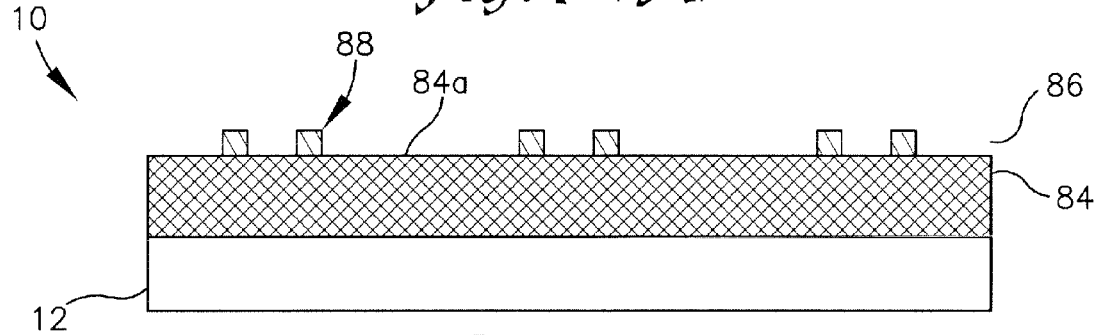
Figure 7:
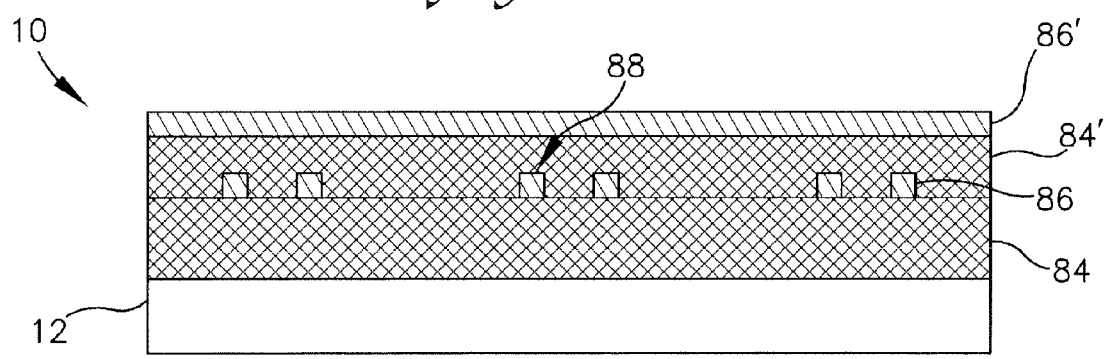
Figure 7:
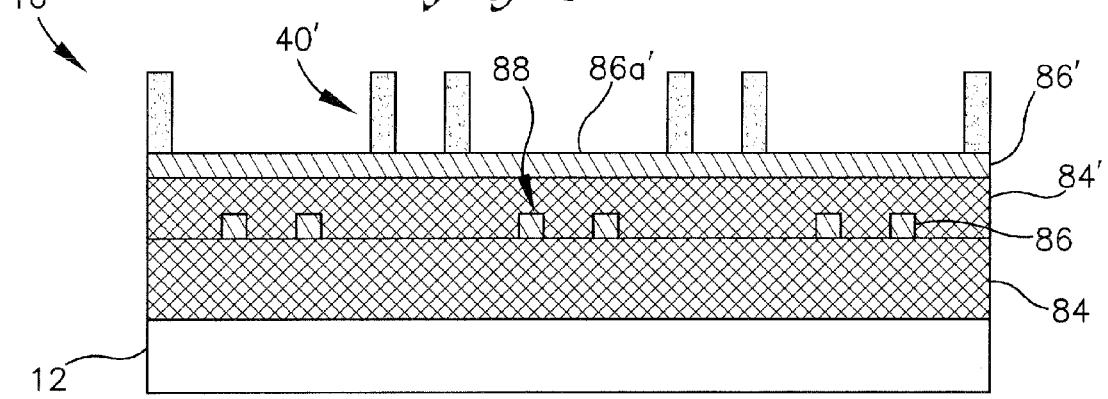
Figure 7:
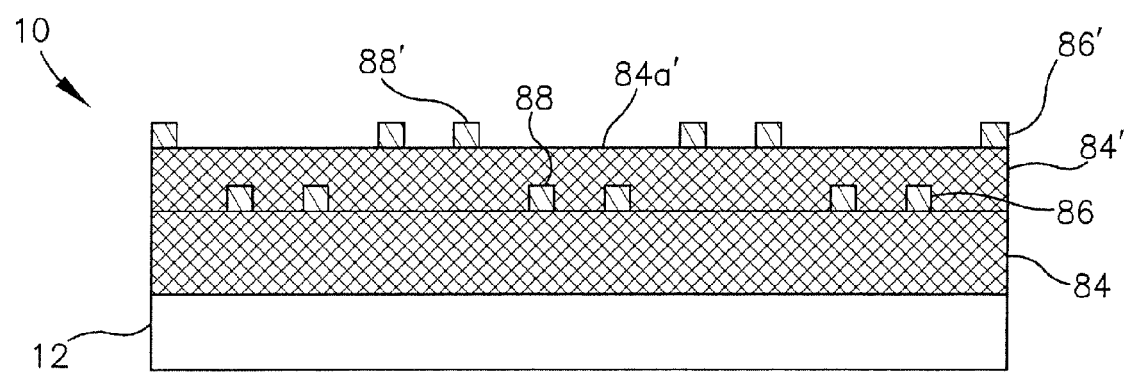
Figure 7:
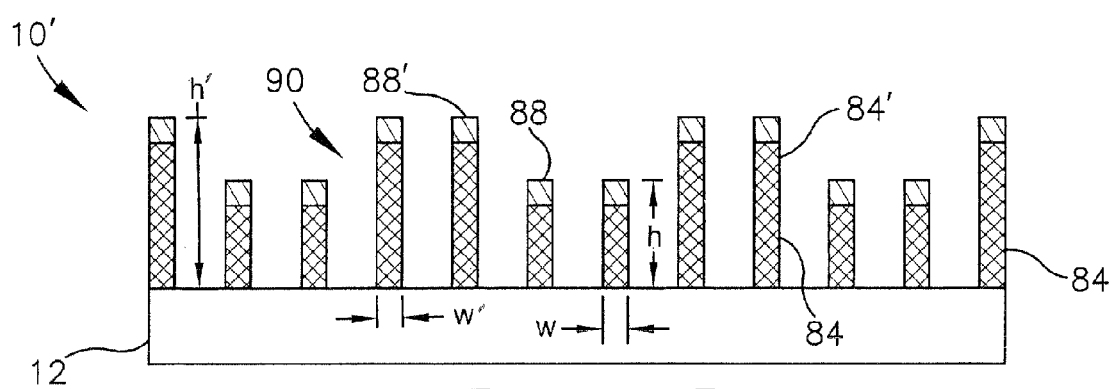

FIG. 7 illustrates a further embodiment of the invention. As shown in FIG. 7(A), a first plurality of undercut-formed features 40 are formed on a stack 10, as described above with respect to FIG. 1. In this embodiment, the stack 10 comprises a substrate 12, a first etch transfer layer 84 adjacent the substrate, and a hardmask 86 adjacent the first etch transfer layer 84, with the undercut-formed features being adjacent the surface 86a of the hardmask 86.

Preferred compositions for use in forming etch transfer layer 84 will be suitable for forming thick layers, and preferably have a solids content of from about 0.1% to about 70%, more preferably from about 5% to about 40%, and more preferably from about 10% to about 30% by weight, based upon the total weight of the composition taken as 100% by weight. Particularly preferred compositions include carbon-rich compositions, which are discussed in more detail below. After the carbon-rich composition is applied, it is preferably heated to a temperature of from about 100° C. to about 300° C., and more preferably from about 160° C. to about 205° C. and for a time period of from about 30 seconds to about 120 seconds (preferably from about 45 seconds to about 60 seconds) to evaporate solvents. For very thick layers 14 (e.g., >500 nm), a two-stage bake can be used by first heating the layer to a temperature of from about 50° C. to about 200° C. (preferably from about 100° C. to about 150° C.) for a time period of from about 30 seconds to about 120 seconds (preferably from about 45 seconds to about 60 seconds), followed by heating the layer to a temperature of from about 160° C. to about 300° C. (preferably from about 180° C. to about 205° C.) for a time period of from about 30 seconds to about 120 seconds (preferably from about 45 seconds to about 60 seconds) to fully cure across the thickness of the layer 84. The average thickness of the etch transfer layer 84 (after baking) is preferably from about 1 nm to about 1,000 nm, more preferably from about 20 nm to about 200 nm, and even more preferably from about 50 nm to about 100 nm.

Any etch resistant composition suitable for use as a hardmask may be use to form first hardmask layer 86. Commercially-available hardmasks that can be used in the invention include OptiStack® HM-710 (Brewer Science, Rolla, Mo.). The average thickness of the first hardmask layer 86 is preferably from about 1 nm to about 100 nm, more preferably from about 10 nm to about 80 nm, and even more preferably from about 20 nm to about 50 nm.

As shown in FIG. 7(B), the stack 10 is then subjected to a first etching to transfer the pattern of the undercut-formed features 40 into the hardmask 86 using the undercut-formed features 40 as an etch mask. This process results in a first plurality of hardmask features 88 adjacent the surface 84a of the first etch transfer layer 84. A second etch transfer layer 84' is formed on the stack overcoating the first plurality of hardmask features 88, followed by a second hardmask layer 86'. The materials used for the second layers could be the same as, or different from, those used in the first processing steps, depending on the desired topography. As shown in FIG. 7(D), a second plurality of undercut-formed features 40' are again formed on the surface 86a' of the second hardmask layer 86', as described above with respect to FIG. 1.

The stack 10 is subjected to a second etching to transfer the pattern of the second plurality of undercut-formed features 40' into the second hardmask layer 86' to yield a second plurality of hardmask features 88' on the surface 84a' of the second etch transfer layer 84', as shown in FIG. 7(E). The stack 10 is then subjected to a third etching to transfer the pattern into the first and second etch transfer layers 84, 84' using the first and second plurality of hardmask features 88, 88' as etch stops. The resulting features 90, as shown in FIG. 7(F), will have a width w, w' of from about 1 nm to about 100 nm, more preferably from about 1 nm to about 50 nm, and even more preferably from about 1 nm to about 20 nm. It will be appreciated that the width of the features 90 can be adjusted by adjusting the amount of undercut when forming the T-shaped structures, as described above with respect to FIG. 1. The height of the features h, h' will vary depending upon the respective thicknesses of the first and second etch transfer layers 84, 84', but will typically range from about 1 nm to about 150 nm, more preferably from about 20 nm to about 80 nm, and even more preferably from about 30 nm to about 60 nm. Advantageously, use of the embedded hardmask allows the formation of features 90 having varying heights h, h', as shown in FIG. 7(F). In some embodiments, the use of a hardmask is optional, and the undercut-formed features 40 themselves can be used as the etch stop for this process.

It will be appreciated that any of the processes described herein could be repeated, as desired, to form numerous different-sized features. These processes can also be used in conjunction with other patterning approaches. It will also be appreciated that the described features herein can eventually be transferred into the substrate, or any intermediate or backside layers that may be present in the stack.

In any of the foregoing embodiments, those skilled in the art will also appreciate that one or more optional intermediate layers could be present between the undercuttable layer and imaging layer. For example, depending upon the material used to form the undercuttable layer in the various embodiments of the invention, suitable intermediate layers include anti-reflective coatings, primer layers, and/or etch mask layers. In particular, if the undercuttable layer does not have anti-reflective properties, it would be desirable to use an anti-reflective coating between the imaging layer and undercuttable layer. Likewise, where the imaging layer is very thin an etch mask layer may be provided between the undercuttable layer and imaging layer. In such embodiments where one or more intermediate layers are present between the undercuttable layer and imaging layer, these layers will be present as part of the generally horizontal section of the resulting T-shaped structures. Thus, using FIG. 1 by way of example, the generally horizontal section 26 would be chemically identical to the imaging layer (after baking) and any intermediate layers that may be present. It will be recognized that the upper surface 34a will correspond to the imaging layer, while the lower surface 34b, which is adjacent the upper portion 28 of the upright leg 24, will correspond to the lowermost intermediate layer, when present. This configuration is equally applicable to any of the T-shaped structures described herein.

While the drawings illustrate, and the specification describes, certain preferred embodiments of the invention, it is to be understood that such disclosure is by way of example only. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing. For example, an etched region illustrated as a rectangle may have rounded or curved features. Thus, the regions illustrated in the figures are schematic in nature and their shapes are not necessarily intended to illustrate the precise shape of a region of a device, unless specifically indicated, and are not intended to limit the scope of the present invention.

Compositions for Use in the Invention

1. Undercuitable Layer

In one aspect of the invention, a developer-soluble composition can be used to form the undercuttable layer. The term "developer-soluble" composition, as used herein, means any suitable composition soluble in developer or capable of being rendered developer-soluble upon exposure to radiation, including conventional anti-reflective coatings, gap-fill compositions, or custom-formulated compositions. As discussed above, the compositions can optionally be photosensitive and/or crosslinkable. The preferred compositions will include a moiety that confers solvent strip resistance to prevent intermixing with subsequent layers, a base soluble group or group capable of being rendered base soluble, and optionally a leaving group (e.g., acid labile group).

The compositions will typically comprise a compound dispersed or dissolved in a solvent system. The compound will generally be selected from the group consisting of polymers, oligomers, and mixtures thereof. Particularly preferred compounds are selected from the group consisting of polyamic acids, acrylates, methacrylates, polyesters, and mixtures thereof. The compound is preferably present in the composition at a level of from about 0.1 to about 10% by weight, preferably from about 0.5 to about 2% by weight, and more preferably from about 0.7 to about 1.5% by weight, based upon the total weight of all ingredients in the composition taken as 100% by weight. If the compound is a polymer, it is preferred that the weight average molecular weight be from about 1,000-100,000 Daltons, and more preferably from about 1,000-25,000 Daltons. If the compound is an oligomer, it is preferred that the weight average molecular weight be from about 500-3,000 Daltons, and more preferably from about 500-1,500 Daltons.

Preferred polymers in some embodiments will comprise an acid functional group. The acid group is preferably present in the compound at a level of at least about 5% by weight, preferably from about 5-90% by weight, and even more preferably from about 5-50% by weight, based upon the total weight of the compound taken as 100% by weight. Preferred acid groups include phenolics, carboxylic acids (—COOH), and mixtures thereof, although in some embodiments phenolics are excluded.

Particularly preferred polyamic acids include recurring monomers having the formulas

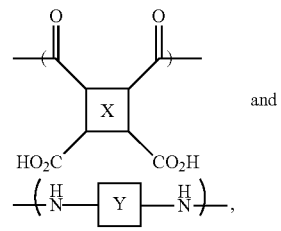

and where each of

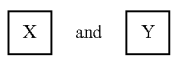

is individually selected from the group consisting of aliphatic and aryl groups. Particularly preferred X and Y groups include those selected from the group consisting of substituted and unsubstituted phenyl, biphenyl, naphthyl, and anthryl groups, and substituted and unsubstituted $C_1$-$C_{12}$ aliphatic (preferably alkyl) groups. These can be formed by polymerizing a dianhydride with a diamine. The synthesis of these polymers and suitable developer-soluble compositions comprising these polymers is described in U.S. Pat. Nos. 7,261,997 and 7,364,835, incorporated by reference herein in their entirety.

Particularly preferred polyamic acids for use in the composition comprise recurring monomers selected from the group consisting of

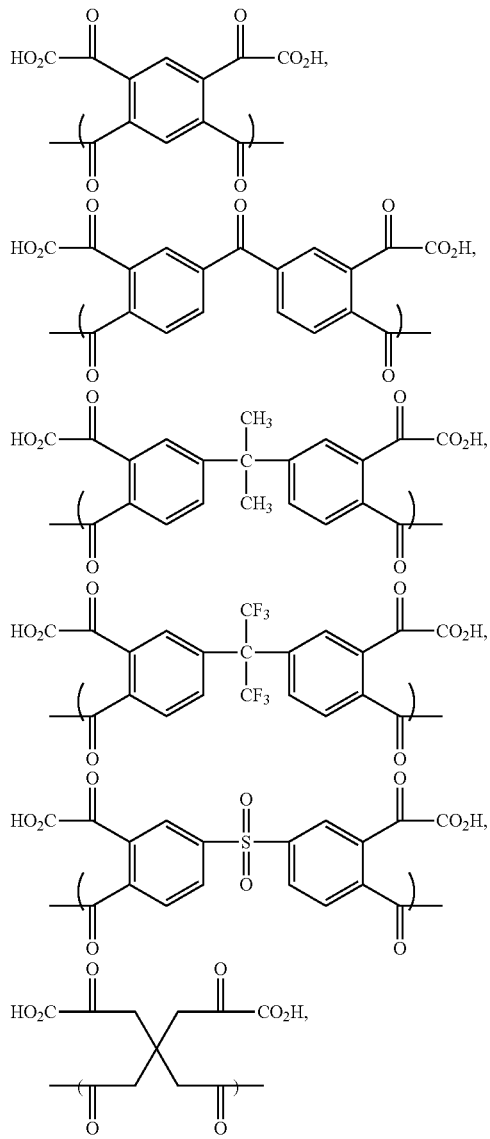

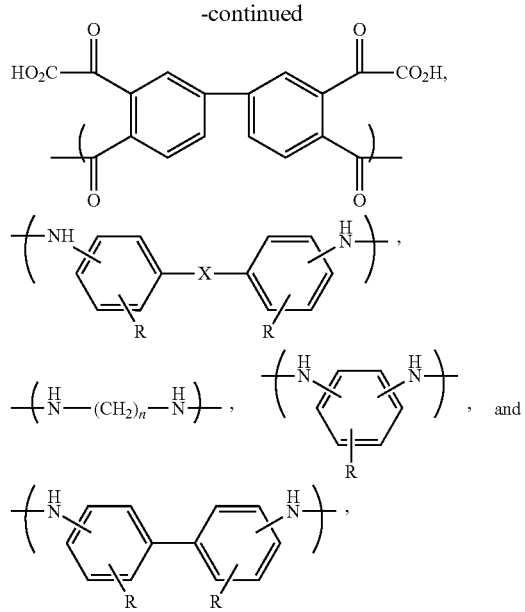

where:
X is selected from the group consisting of —O—, —S—, —CH$_2$—, —C(CF$_3$)$_2$—, and —C(CH$_3$)$_2$—;
n is 2-8; and
each R is individually selected from the group consisting of —H and —OH.

Non-covalently crosslinkable (e.g., hydrogen bonded) polymers, can also be used in the inventive methods. The terms "non-covalent crosslinking," "non-covalently crosslinked," or "non-covalently crosslinkable" are used herein to refer to crosslinking that does not involve the intimate sharing of pairs of electrons, as in covalent bonding, but rather involves more dispersed variations of electromagnetic interactions. Preferred examples of non-covalent crosslinking include hydrogen bonding and electrostatic intermolecular attraction. In general, once crosslinked, these compounds will comprise linkages having the formula selected from the group consisting of —OH—O, —OH—N, —NH—O, or —NH—N, and combinations of the foregoing. Particularly preferred non-covalently crosslinkable polymers will comprise recurring monomers of

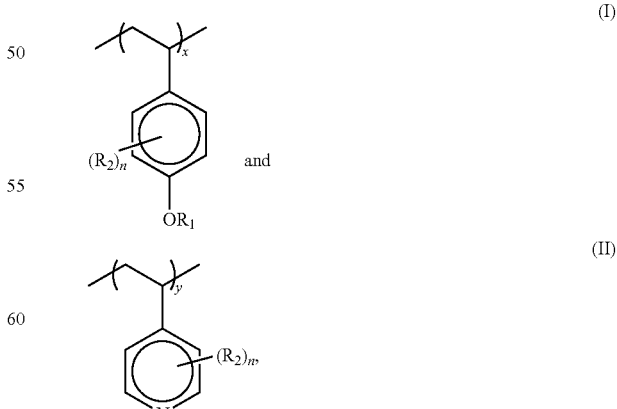

In the above formulas, n is 0-4, and the molar ratio of x:y is from about 1:3 to about 3:1. $R_1$ is a protecting group, and each $R_2$ is individually selected from the group consisting of alkyls, halogens, —OH, and multifunctional phenols. Exemplary protecting groups are selected from the group consisting of

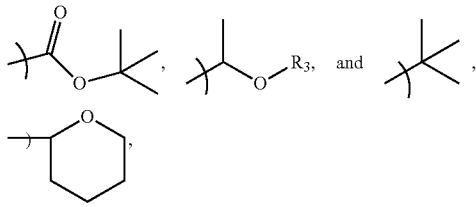

where $R_3$ is selected from the group consisting of alkyls.

Particularly preferred vinyl ether crosslinkers for use in the compositions have the formula

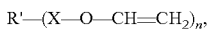

where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of

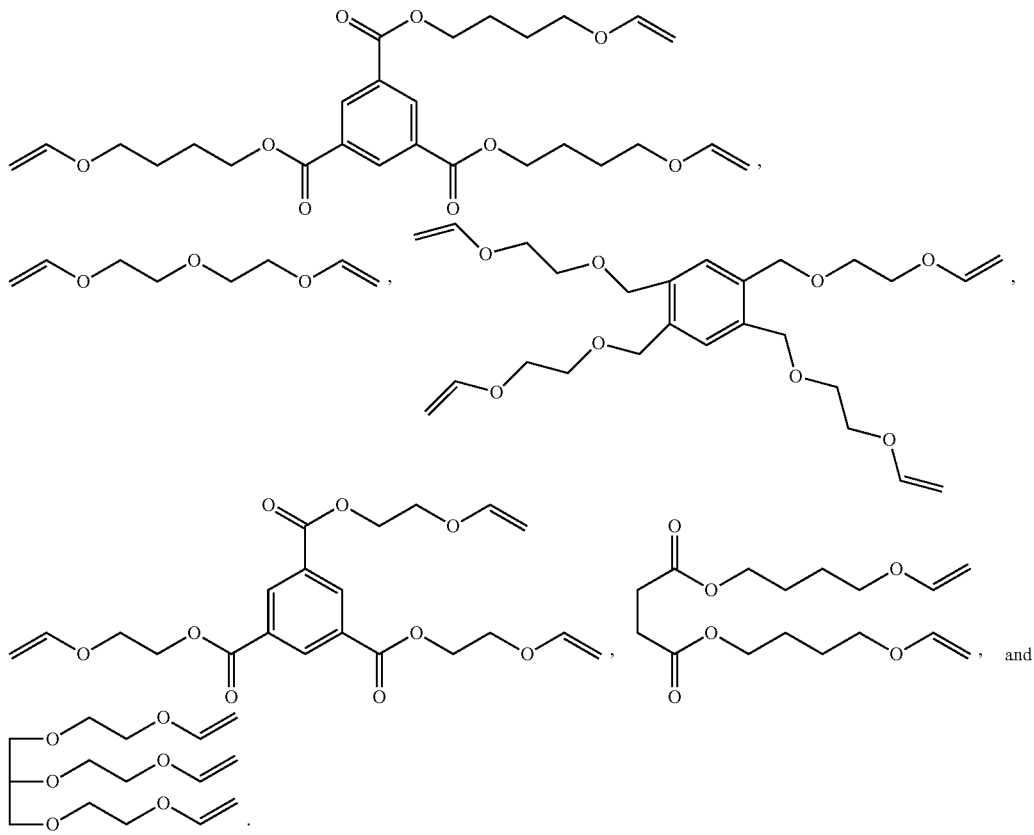

Compounds for use in anti-reflective coatings and gap-fill compositions suitable for the undercuttable layer can be crosslinkable. Thus, in some embodiments, the compositions will also comprise a crosslinking agent dispersed or dissolved in the solvent system with the compound. Suitable crosslinking agents include aminoplasts (e.g., POWDER-LINK® 1174, CYMEL®, both from Cytec Industries), multi-functional epoxies (e.g. CY179MA from Vantico, MY720 from Ciba-Geigy), cyanurates (triepoxy propyl isocyanurate), and vinyl ethers, with vinyl ethers and epoxies being particularly preferred. An example of a commercially-available vinyl ether includes those sold under the trade name VECTomer™ (Aldrich; St. Louis, Mo.).

Figure 26:
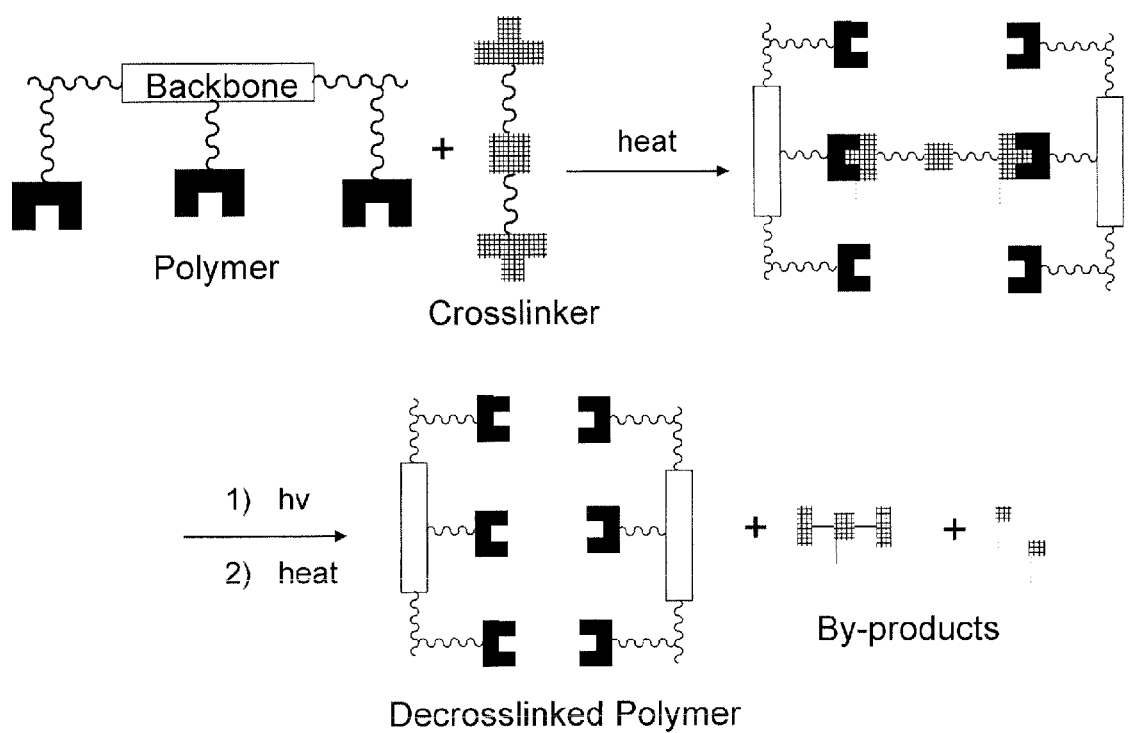
FIG. 26 is a schematic illustration of a reaction showing the crosslinking and decrosslinking of the undercuttable layer.

In these embodiments, the developer-soluble undercuttable layer undergoes crosslinking during baking to yield a crosslinked or cured layer, as described above. The cured layer must be decrosslinked to be rendered developer soluble. This reaction scheme is depicted in FIG. 26.

It will be appreciated that after this decrosslinking has occurred, the undercuttable layer is rendered developer soluble.

Decrosslinking is generally initiated by a catalyst present in the developer-soluble composition, such as a photoacid generator (PAG) or thermal acid generator (TAG). Suitable PAGs include onium salts (e.g., triphenyl sulfonium perfluorosulfonates such as TPS nonaflate, TPS triflate, and substituted forms thereof, such as tris(4-tert-butylphenyl) sulfonium perfluoro-1-butanesulfonate (an alkyl-substituted TPS nonaflate), all available from Sigma-Aldrich); oximesulfonates (e.g., those sold under the name CGI® by CIBA); triazines (e.g., TAZ108® available from Midori Kagaku Company); and combinations thereof. Suitable TAGs include sulfonic acids (e.g., sulfonic esters, p-toluenesulfonic acid, dinonylnaphthalenesulfonic acid), triflic acids, and the like available under the name K-PURE® sold by King Industries. Upon exposure to light, an acid is generated from the acid generator, and this acid "decrosslinks" the compound in the layer. That is, the acid catalyzes breaking of the bond that was formed between the compound and the crosslinker upon thermal crosslinking. When the polymer or oligomer comprises an acid group, such as a carboxylic acid, decrosslinking results in the formation of the same polymer or oligomer originally present in the composition as well as an alcohol and an acetylaldehyde.

In some embodiments, such as the non-covalently crosslinkable compositions, the composition self-crosslinks without the aid of a crosslinking agent. Thus, in other aspects of the invention, including non-covalently crosslinkable as well as non-photosensitive embodiments, the developer-soluble composition is preferably substantially free of crosslinking agents. The compositions can also be substantially free of acid generators (e.g., PAGs, TAGs, etc.). "Substantially free" means that the compositions include less than about 0.1% by weight, preferably less than about 0.05%, and preferably about 0% by weight of the ingredient, based upon the total weight of the composition taken as 100% by weight. The composition can also be substantially free of other agents capable of initiating crosslinking/decrosslinking, either thermally or via light exposure.

Anti-reflective compositions, when used, will also typically comprise a chromophore (light attenuating compound or moiety). The chromophore can be bonded with the compound (either to a functional group on the compound or directly to the polymer backbone or oligomer core), or the chromophore can simply be physically mixed in the composition. The chromophore is selected based upon the wavelength at which the compositions will be processed. For example, at wavelengths of 248 nm, preferred chromophores include naphthalenes (e.g., naphthoic acid methacrylate, 3,7-dihydroxynaphthoic acid), heterocyclic chromophores, carbazoles, anthracenes (e.g., 9-anthracene methyl methacrylate, 9-anthracenecarboxylic acid), and functional moieties of the foregoing. At wavelengths of 193 nm, preferred chromophores include substituted and unsubstituted phenyls, heterocyclic chromophores (e.g., furan rings, thiophene rings), and functional moieties of the foregoing.

Additional ingredients that can be present in the composition include surfactants, adhesion promoters, or surface modifiers.

Regardless of the embodiment, the compositions are formed by simply dispersing or dissolving the polymers, oligomers, or mixtures thereof in a suitable solvent system, preferably at ambient conditions and for a sufficient amount of time to form a substantially homogeneous dispersion. The other ingredients (e.g., crosslinker, PAG) are preferably dispersed or dissolved in the solvent system along with the compound.

Preferred solvent systems include a solvent selected from the group consisting of propylene glycol methyl ether acetate (PGMEA), propylene glycol methyl ether (PGME), propylene glycol n-propyl ether (PnP), ethyl lactate, cyclohexanone, Gamma butyrolactone (GBL), and mixtures thereof. The solvent system should be utilized at a level of from about 80-99% by weight, and preferably from about 95-99% by weight, based upon the total weight of the composition taken as 100% by weight. Thus, the compositions typically have a solids content of from about 1-20% by weight, and preferably from about 1-5% by weight, based upon the total weight of the composition taken as 100% by weight.

Exemplary developer-soluble compositions include ARC® DS-K101 (Brewer Science, Rolla, Mo.), and ARC® DS-A520 (ArF photosensitive anti-reflective coating; Brewer Science, Rolla, Mo.). Additional compositions for use in the inventive methods are also disclosed in U.S. Pat. Nos. 6,872,506, 7,261,997, 7,364,835, 7,601,483, and 7,914,974, as well as U.S. Pat. App. Pub. Nos. 2007-0207406 and 2009/0035590, incorporated by reference herein in their entireties.

2. Selectively Etchable Composition

Selectively etchable compositions suitable for use in forming the undercut-formed features described herein must be robust enough to resist aggressive etch processing without degradation of the very small feature sizes, but also delicate enough to fill the extremely small undercut areas formed by the inventive methods. Exemplary materials will comprise silicon- and/or metal-containing compounds, oxides thereof, and combinations thereof. Suitable silicon-containing compounds for use in the invention include $Si_3N_4$, $SiO_2$, SiC, SiON, and combinations thereof. Suitable metal containing compounds for use in the invention include Hf, Al, Ti, Sb, Ge, Zr, Zn, Mg, Sr, Ba, Pb, Au, Ag, Cu, the oxides thereof, and combinations thereof. The compounds can be nanoparticles, nanocolloidal materials, or low molecular weight polymers. Nanoparticles and nanocolloidal materials must have an average particle size smaller than the undercut area to be filled. Preferably, the average particle size will range from about 0.5 nm to about 10 nm, more preferably from about 1 nm to about 7 nm, and even more preferably from about 2 nm to about 5 nm. The average particle size refers to the median maximum surface-to-surface dimension of the particles. For example, in the case of spherical particles the average size would be the median diameter of the particles in the compositions.

Likewise, low molecular weight polymers must have a chain size sufficiently small to flow into the undercut area to be filled. Low molecular weight silicon-containing polymers for use in the composition will preferably have a weight average molecular weight of from about 1,000 to about 100,000 Daltons, preferably around from about 8,000 to about 30,000 Daltons, and more preferably from about 10,000 to about 25,000 Daltons. Low molecular weight metal-containing polymers for use in the composition will preferably be from about 1,000 to about 100,000 Daltons, more preferably from about 2,000 to about 20,000 Daltons, and even more preferably from about 2,000 to about 15,000 Daltons.

The selectively etchable composition is formed by dispersing or dissolving the silicon- and/or metal-containing compound in a suitable solvent system, preferably at ambient conditions and for a sufficient amount of time to form a substantially homogeneous dispersion. Preferred solvent systems include a solvent selected from the group consisting of water. MIBC, methylene, and mixtures thereof. The solvent system should be utilized at a level of from about 90 to about 99.9% by weight, preferably from about 95 to about 99.5% by weight, and more preferably from about 98 to about 99% by weight, based upon the total weight of the composition taken as 100% by weight. Thus, the compositions typically have a solids content of from about 0.1 to about 3% by weight, preferably from about 0.5 to about 2.5% by weight, and more preferably from about 1 to about 2% by weight, based upon the total weight of the composition taken as 100% by weight. Any additional ingredients (e.g., surfactants, photoacid generators (PAGs), thermal acid generators (TAGs), photo-bases, etc.) can be included in the solvent system with the etch-resistant compounds.

Compositions can be specially formulated for the selectively etchable compositions, or suitable commercially-available hardmask compositions, such as a silicon hardmask (e.g., OptiStack® HM710 (Brewer Science Inc., Rolla, Mo.)), can be diluted using the above-described solvent system to achieve the desired solids level for use in the invention.

3. Conformal Layers

Compositions suitable for use in forming the first conformal layer include compositions that can be deposited as a conformal layer (i.e., one that conforms to and evenly coats the top surfaces and sidewalls of the topography of the underlying layers and structures), as opposed to a planarizing layer, but can be easily removed without damaging the underlying structures, for example by using a wet development or oxygen ash step. Exemplary compositions include carbon-rich compositions, as well as certain developer-soluble compositions described above. The term "carbon-rich," as used herein, refers to compositions comprising greater than about 50% by weight carbon, preferably greater than about 70% by weight carbon, and more preferably from about 75 to about 80% by weight carbon, based upon the total solids in the composition taken as 100% by weight. Suitable carbon-rich compositions include spin-on carbon compositions (SOC) and amorphous carbon compositions. Exemplary carbon-rich compositions will generally comprise a polymer dispersed or dissolved in a solvent system, along with the following optional ingredients: acid and/or base quenchers, catalysts, crosslinking agents, and surface modification additives. Preferred compositions will preferably have a solids content of from about 0.1% to about 10% by weight, more preferably from about 0.5% to about 7%, and more preferably from about 1% to about 5% by weight, based upon the total weight of the composition taken as 100% by weight.

Compositions suitable for forming the second conformal layer include compositions that can be deposited as a conformal layer, but are resistant to etching, and more preferably are resistant specifically to a fluorinated etchant. Exemplary compositions include silicon- and/or metal-containing compounds, oxides thereof, and combinations thereof. Suitable silicon-containing compounds for use in the invention include $Si_3N_4$, $SiO_2$, SiC, SiON, and combinations thereof. Suitable metal containing compounds for use in the invention include Hf, Al, Ti, Sb, Ge, Zr, Zn, Mg, Sr, Ba, Pb, Au, Ag, Cu, the oxides thereof, and combinations thereof. Preferred compositions for use in forming the second conformal layer will preferably have a solids content of from about 0.1% to about 10% by weight, more preferably from about 0.5% to about 5%, and more preferably from about 1% to about 4% by weight, based upon the total weight of the composition taken as 100% by weight.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Undercutting and Creation of Template

A silicon wafer was spin-coated with an anti-reflective composition (ARC® DS-K101-307; Brewer Science, Rolla, Mo.) 800 rpm for 30 seconds, using a TEL ACTS cleantrack, yielding a 40-nm layer. The anti-reflective coating was then baked at 180° C. for 60 seconds. A photoresist composition (M529Y-4-cP; JSR, Sunnyvale, Calif.) was then spin-coated onto the anti-reflective layer at 1,898 rpm for 30 seconds to yield a 200-nm layer on the top of the stack. The photoresist was then subjected to a post-application bake at 130° C. for 90 seconds. An ASML750 scanner (KrF) was used for exposure according to the parameters in Table 1 below.

TABLE 1

| Parameter | Condition | Notes |
|---|---|---|
| Target CD (nm/pitch) | 180L/1060P | LF |
| Illumination mode | Annular | |
| NA | 0.70 | |
| Sigma (outer/inner) | 0.875/0.575 | |
| Center dose (mJ/cm$^2$) | 15/0 | x-axis |
| Focus offset/step (μm) | 0/0 | y-axis |
| Reticle bar code | TM99%/MEBESV2 | Box 28 |

Figure 8:
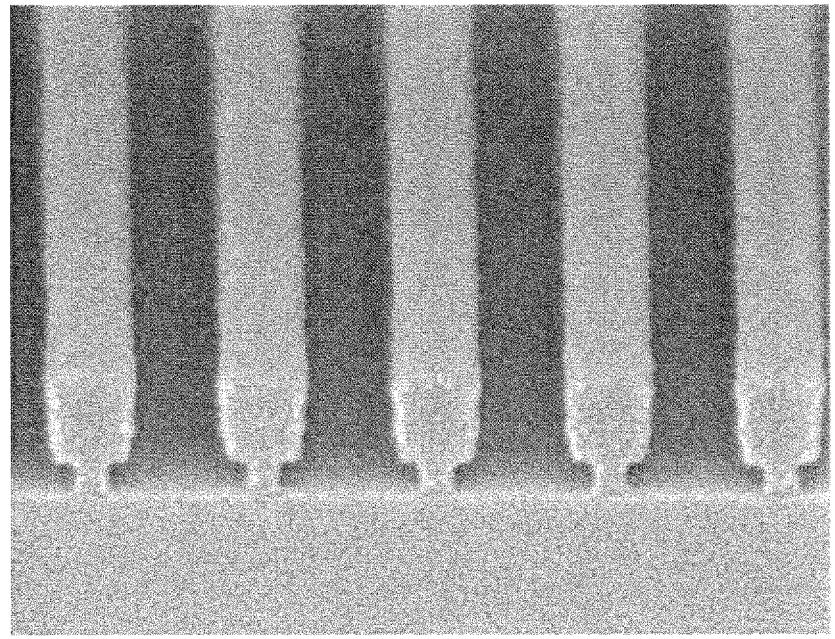
FIG. 8 is a scanning electron microscope (SEM) photograph of T-shaped structures formed in Example 1.
Figure 9:
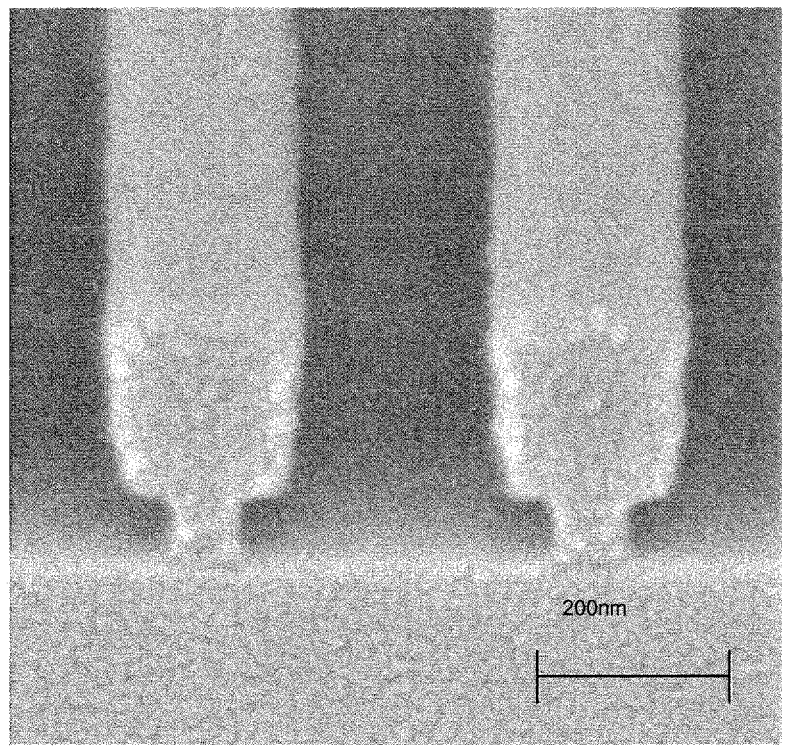
FIG. 9 is an enlarged SEM photograph of T-shaped structures formed in Example 1.

The photoresist was then post-exposure baked at 125° C. for 90 seconds. The exposed portions of the photoresist and adjacent portions of the anti-reflective layer were then developed and undercut by contacting with tetramethylammonium hydroxide (OPD 262) for 45 seconds. FIG. 8 is an SEM image of the patterned stack showing the resulting T-shaped template structures formed by undercutting the photoresist and lateral removal of the anti-reflective coating. FIG. 9 is an enlarged view of the template structures.

Example 2

Filling of Undercut Features and Removal of Template

Figure 10:
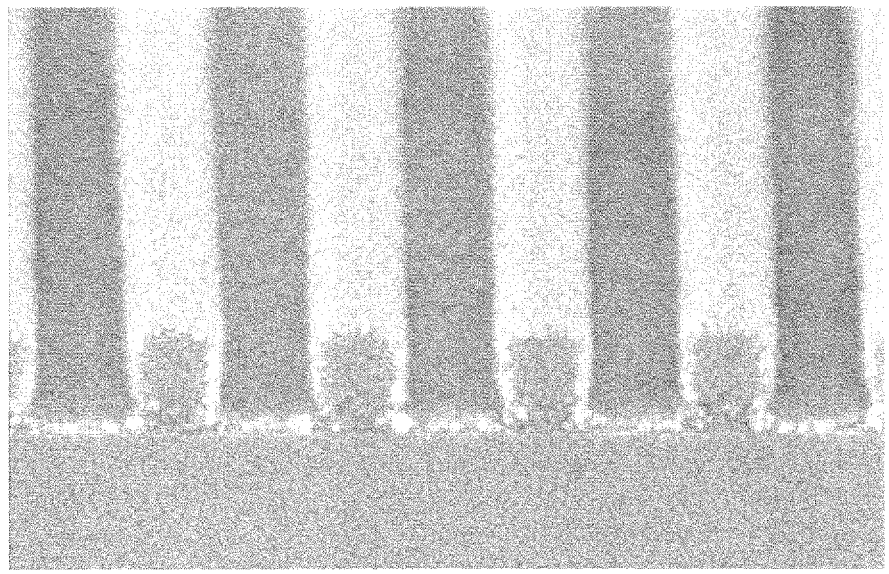
FIG. 10 is an SEM photograph of undercut-filled T-shaped structures formed in Example 2.
Figure 11:
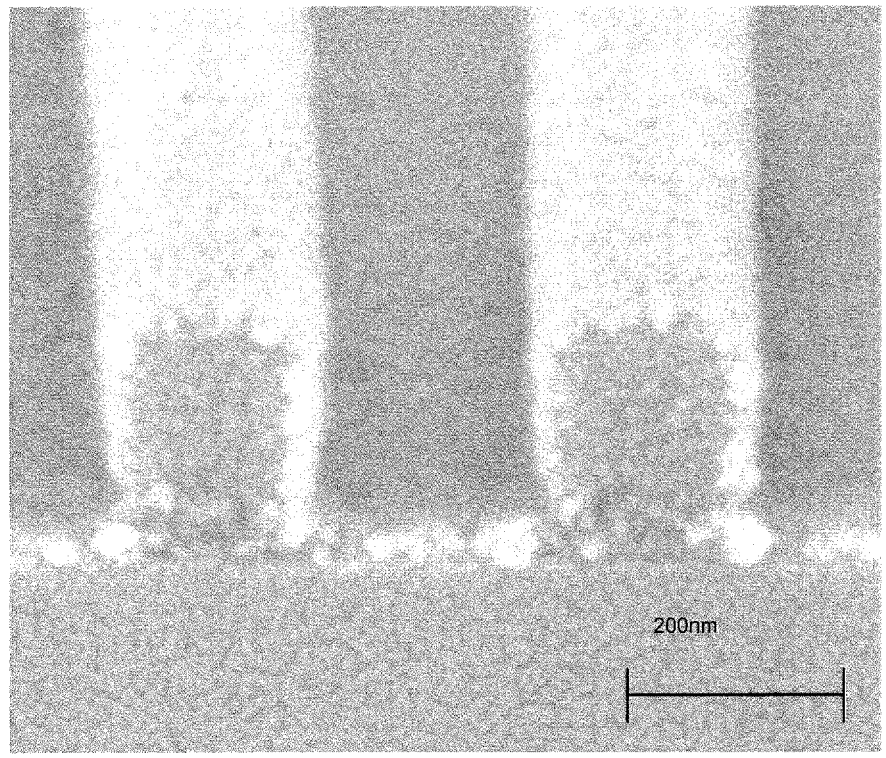
FIG. 11 is an enlarged SEM photograph of undercut-filled T-shaped structures formed in Example 2.

The undercut portions of the template structures prepared in Example 1 were then filled with an etch-resistant material. An experimental silica nanoparticle colloidal fill material (2-10 nm average particle size; Brewer Science) was spin-coated onto the patterned stack at 1,500 rpm for 60 seconds using a Brewer Science® Cee® CB200 coat/bake module, followed by baking at 110° C. for 60 seconds. FIG. 10 is an SEM image of the etch resistant material filling the undercut portions of the template structures. FIG. 11 is an enlarged SEM image of FIG. 10.

Figure 12:
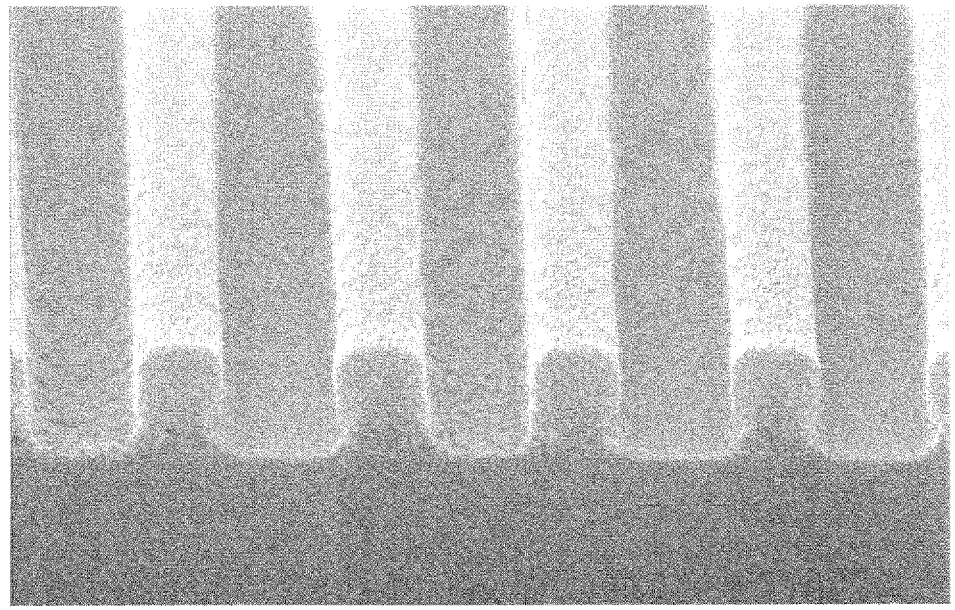
FIG. 12 is an SEM photograph of undercut-filled T-shaped structures formed in Example 2 after etching away excess selectively etching material.
Figure 13:
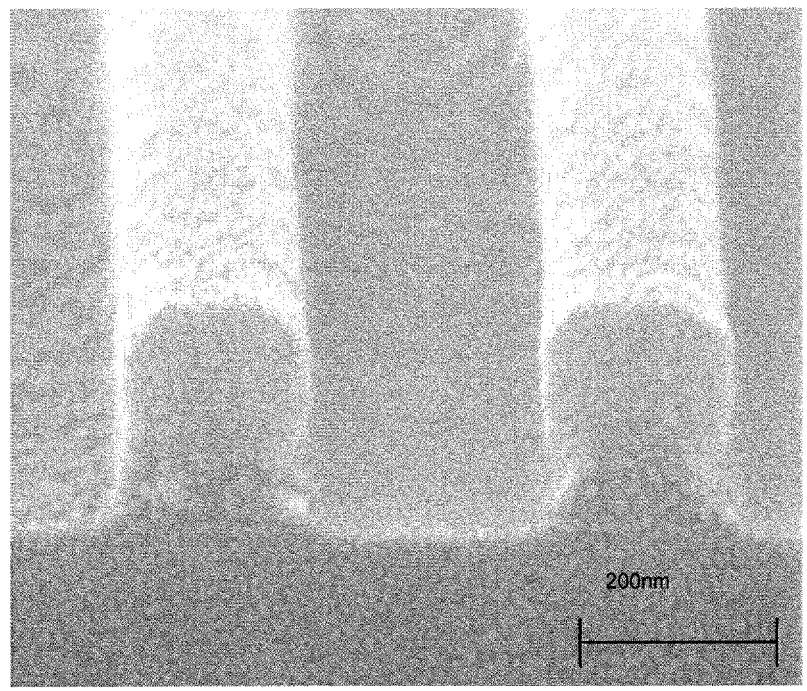
FIG. 13 is an enlarged SEM photograph of undercut-filled T-shaped structures formed in Example 2 after etching away excess selectively etching material.

A reactive ion etch was then performed using an Oxford etcher to remove the etch resistant material from the stack except in the undercut portions. The etch gas used was $CF_4$ at 50 sccm, and the wafer was processed for 46 seconds at 100 watts of power, 50 mTorr pressure, and a DC-bias of 377. FIG. 12 is an SEM image of the features after etching, with an enlarged view shown in FIG. 13.

Figure 14:
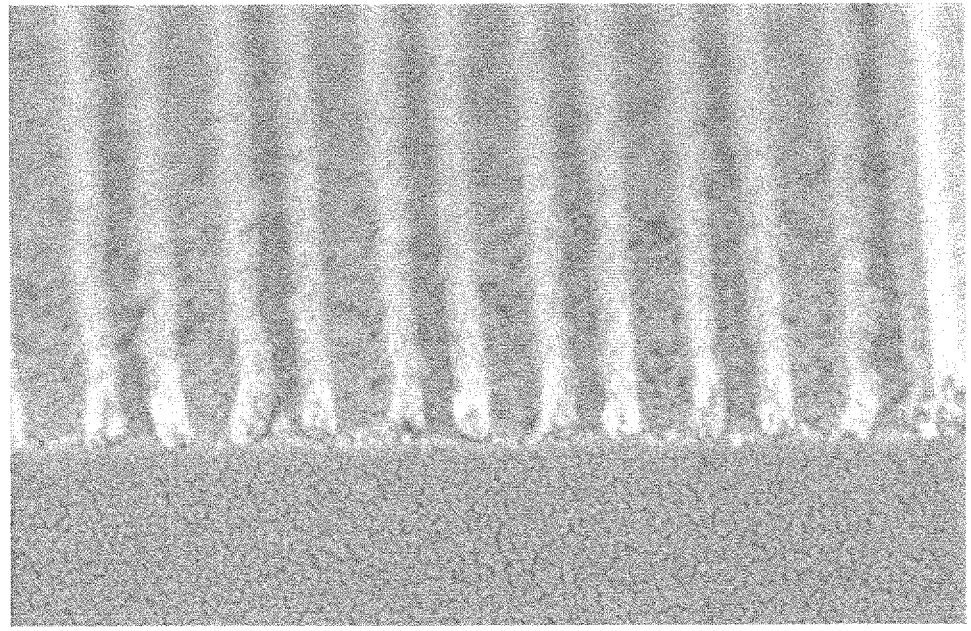
FIG. 14 is an SEM photograph of undercut-formed features from 150-nm T-shaped structures formed in Example 2.
Figure 15:
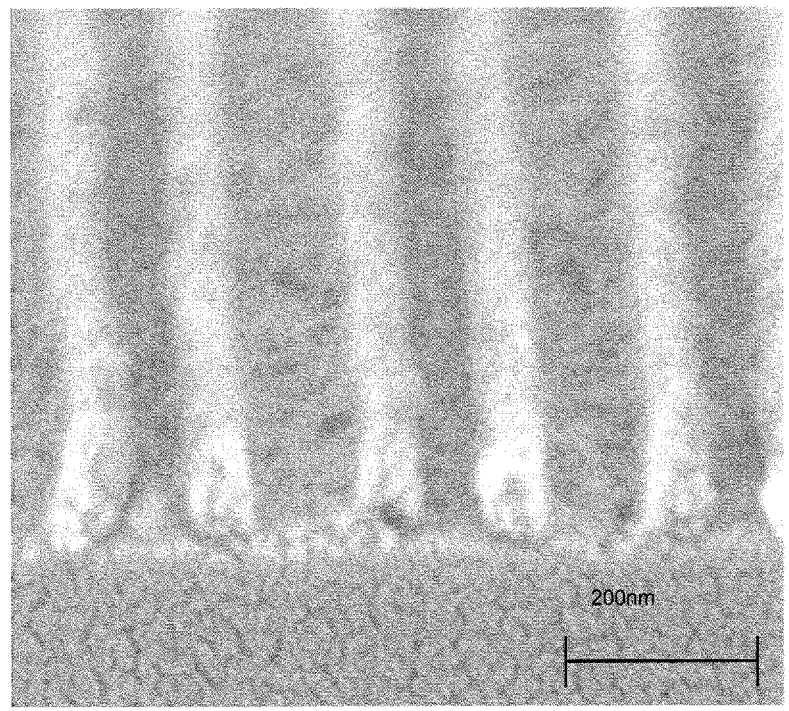
FIG. 15 is an enlarged SEM photograph of undercut-formed features from 150-nm T-shaped structures formed in Example 2.
Figure 16:
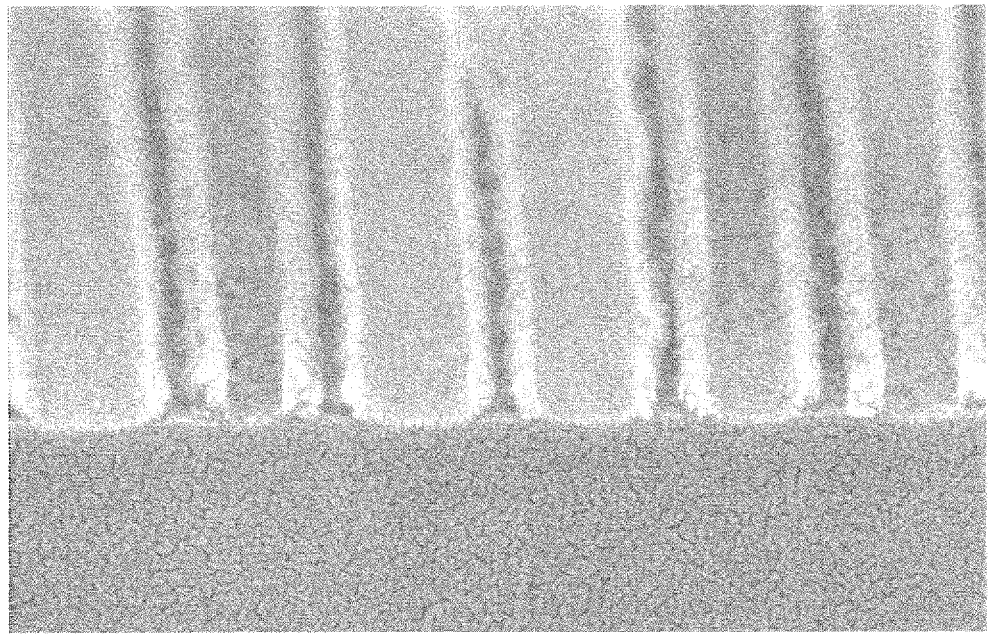
FIG. 16 is an SEM photograph of undercut-formed features from 160-nm T-shaped structures formed in Example 2.
Figure 17:
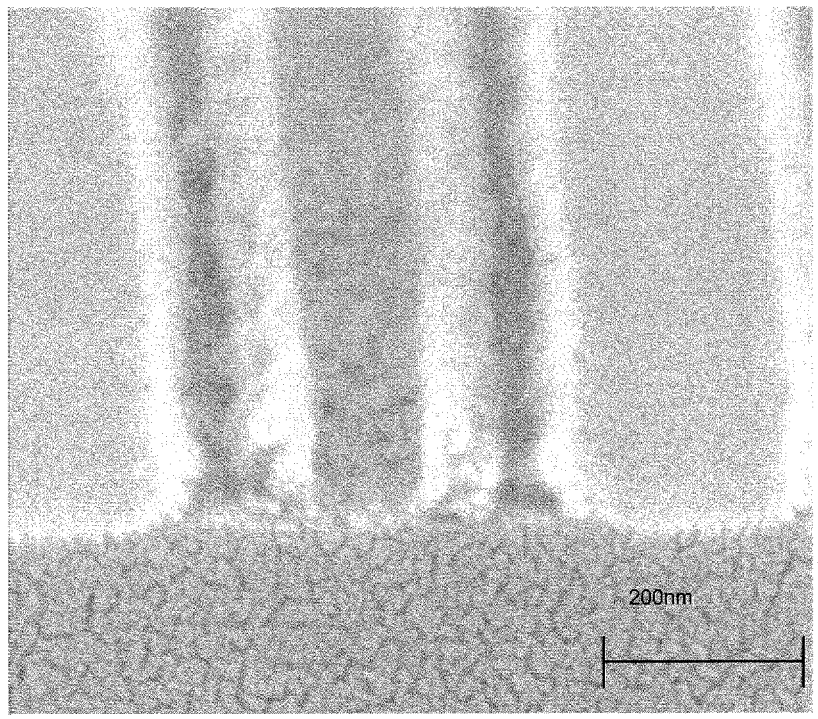
FIG. 17 is an enlarged SEM photograph of undercut-formed features from 160-nm T-shaped structures formed in Example 2.
Figure 18:
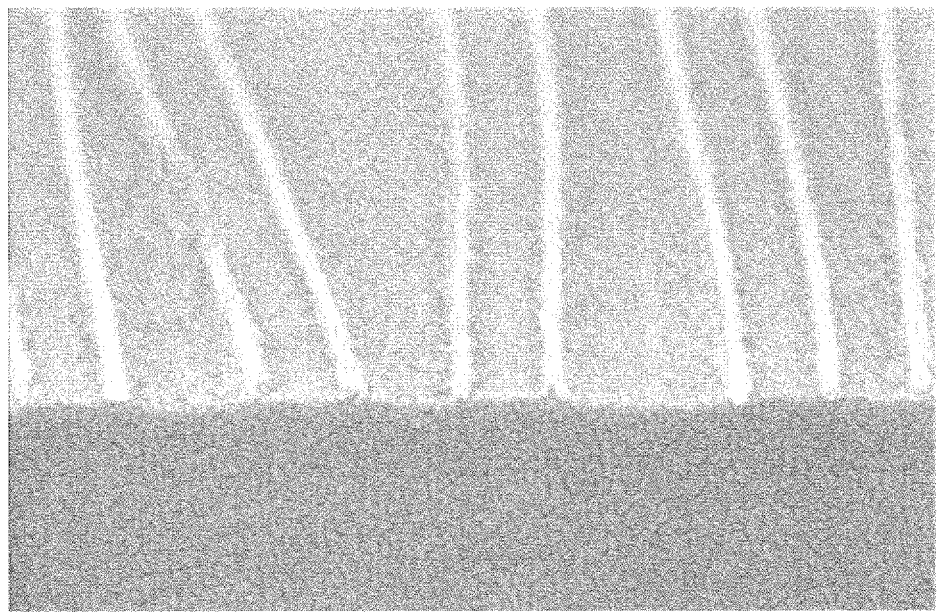
FIG. 18 is an SEM photograph of undercut-formed features from 180-nm T-shaped structures formed in Example 2.
Figure 19:
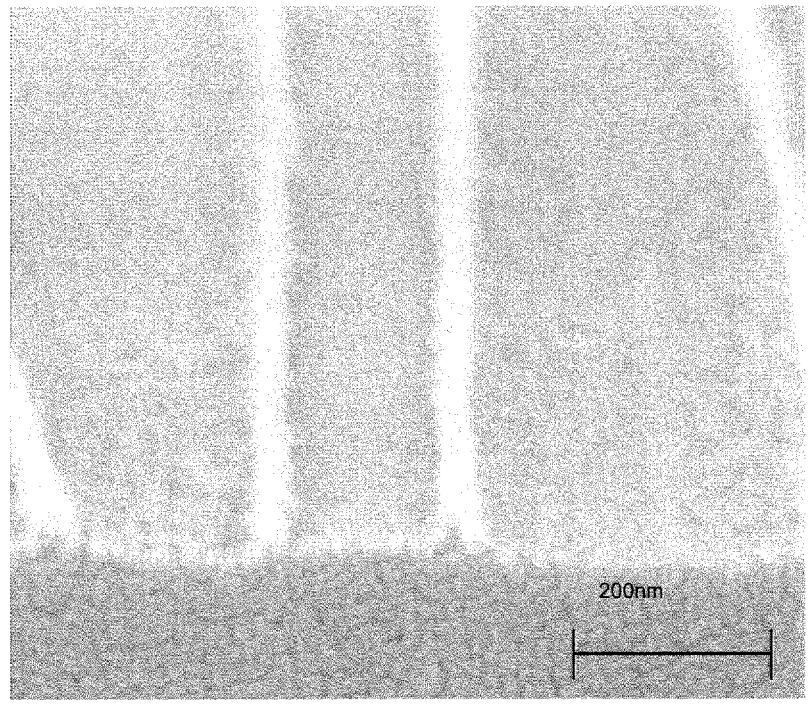
FIG. 19 is an enlarged SEM photograph of undercut-formed features from 180-nm T-shaped structures formed in Example 2.

A second reactive ion etch was then performed using $O_2$ as the etch gas at 50 sccm, for 60 seconds at 100 watts of power, 60 mTorr pressure, and a DC-bias of 377. SEM images of the stack after removal of the T-shaped structures to leave behind the etch resistant material from the undercut portions are shown in the Figures. FIGS. 14 and 15 are SEM images of the lines left behind by 150-nm initial (T-shaped) structures. FIGS. 16 and 17 are SEM images of the lines left behind by 160-nm initial (T-shaped) structures. FIGS. 18 and 19 are SEM images of the lines left behind by 180-nm initial (T-shaped) structures. As larger initial line sizes were examined, smaller resulting features were observed, most likely from the change in amount of undercut when the template was made. The 180-nm initial feature produced 30-nm final features of etch resistant material.

Example 3

Undercutting and Creation of Template

A layer of anti-reflective composition (ARC® DS-K101-307; Brewer Science, Rolla, Mo.) was coated onto a silicon wafer at 1,500 rpm for 30 seconds, using a TEL ACT8 cleantrack, yielding a 70-nm layer. The anti-reflective coating was then baked at 180° C. for 60 seconds. A photoresist composition (M529Y-4-cP; JSR, Sunnyvale, Calif.) was then spin-coated onto the anti-reflective layer at 1,898 rpm for 30 seconds to yield a 200-nm layer on the top of the stack. The photoresist was then subjected to a post-application bake at 130° C. for 90 seconds. An ASML750 scanner (KrF) was used for exposure according to the parameters in Table 2 below.

TABLE 2

| Parameter | Condition | Notes |
| --- | --- | --- |
| Target CD (nm/pitch) | 180L/1060P | LF |
| Illumination mode | Annular | |
| NA | 0.70 | |
| Sigma (outer/inner) | 0.875/0.575 | |
| Center dose (mJ/cm$^2$) | 15/0 | x-axis |
| Focus offset/step (μm) | 0/0 | y-axis |
| Reticle bar code | TM99%/MEBESV2 | Box 28 |

Figure 20:
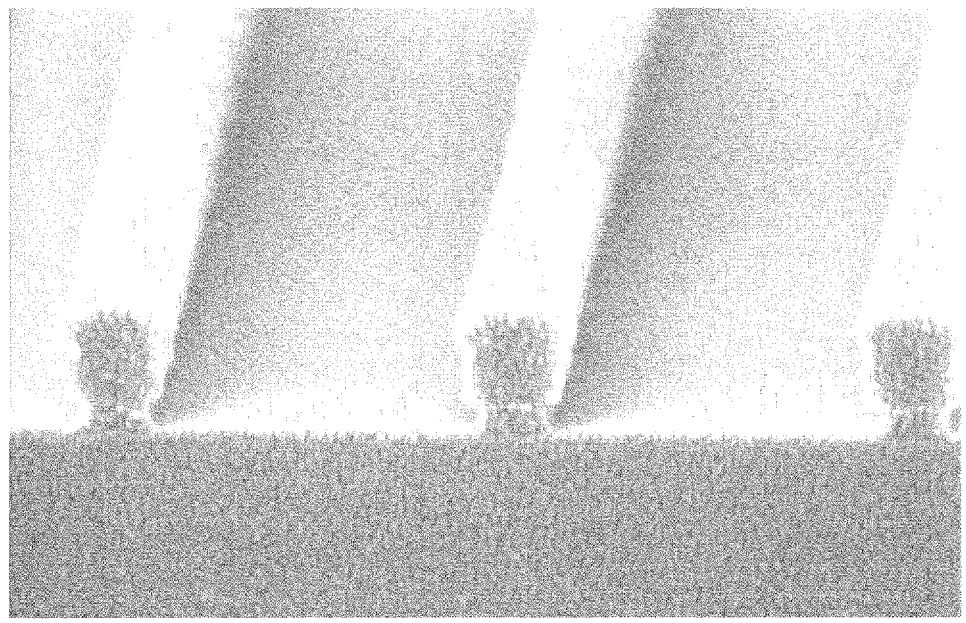
FIG. 20 is an SEM photograph of T-shaped structures formed in Example 3.

The photoresist was then post-exposure baked at 125° C. for 90 seconds. The exposed portions of the photoresist and adjacent portions of the anti-reflective layer were then developed and undercut by contacting with tetramethylammonium hydroxide (OPD 262) for 45 seconds. FIG. 20 is an SEM image of the patterned stack showing the resulting T-shaped template structures formed by undercutting the photoresist and anti-reflective coating.

Example 4

Filing of Undercut Features and Removal of Template

Figure 21:
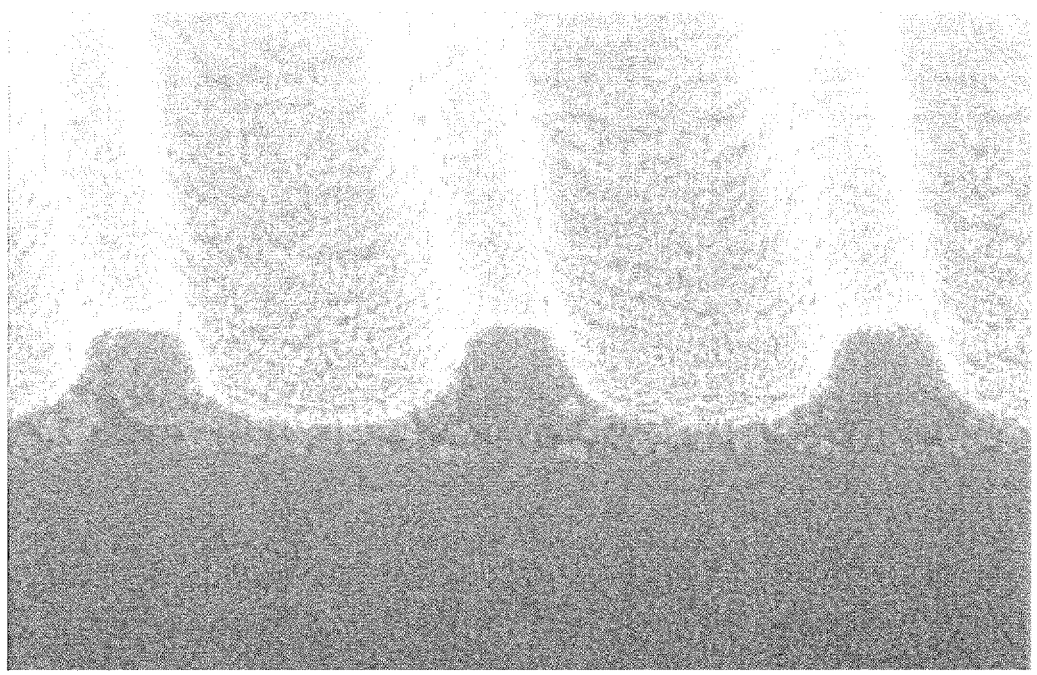
FIG. 21 is an SEM photograph of T-shaped structures coated with selectively etching material from Example 4.

The undercut portions of the template structures prepared in Example 3 were then filled with an etch-resistant material. An experimental silica nanopartiele colloidal fill material (Brewer Science) was spin-coated onto the patterned stack at 500 rpm for 30 seconds using a Brewer Science® Cee® CB200 coat/bake module, followed by baking at 100° C. for 60 seconds. FIG. 21 is an SEM image of the etch resistant material filling the undercut portions of the template structures.

Figure 22:
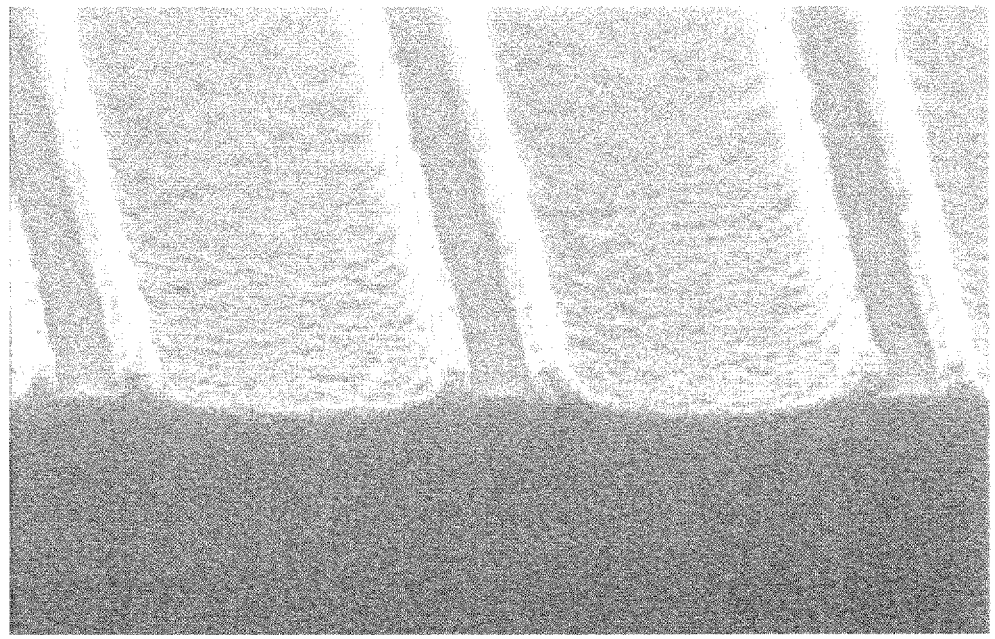
FIG. 22 is an SEM photograph of undercut-formed features from Example 4.
Figure 23:
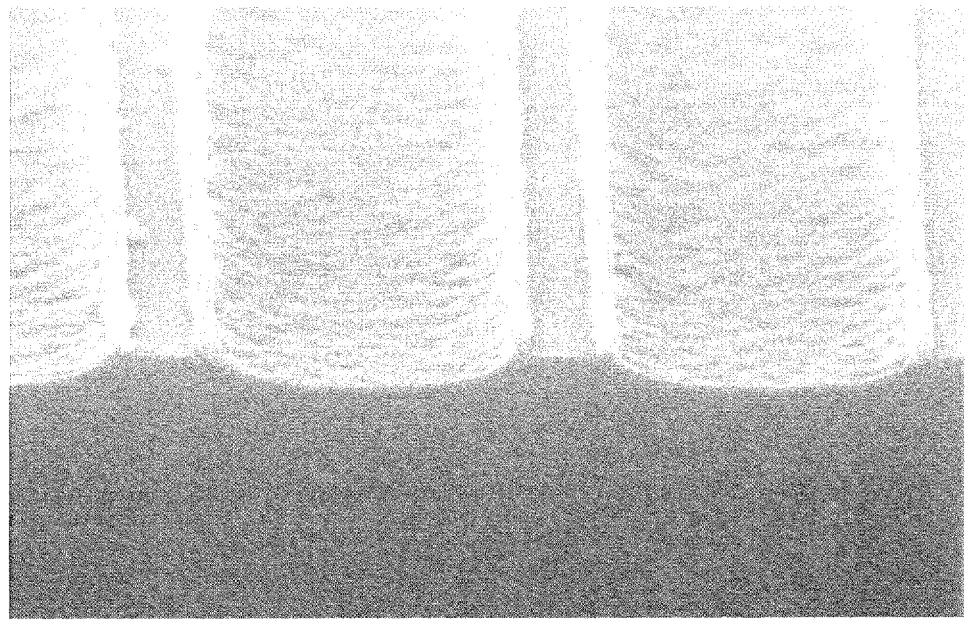
FIG. 23 is an SEM photograph of additional undercut-formed features from Example 4.

A reactive ion etch was then performed using an Oxford etcher to remove the etch resistant material from the stack except in the undercut portions. The etch gas used was a mixture of $CF_4$ at 50 sccm and $N_2$ at 30 sccm, and the wafer was processed for 120 seconds at 100 watts of power, 25 mTorr pressure, and a DC-bias of 377. A second reactive ion etch was then performed using $O_2$ at 50 sccm, and the wafer was processed for 90 seconds at 100 watts of power, 60 mTorr pressure, and a DC-bias of 377. SEM images of the stack after removal of the T-shaped structures to leave behind the etch resistant material from the undercut portions are shown in FIGS. 22 and 23.

Example 5

Filing of Undercut Features and Removal of Template

Figure 24:
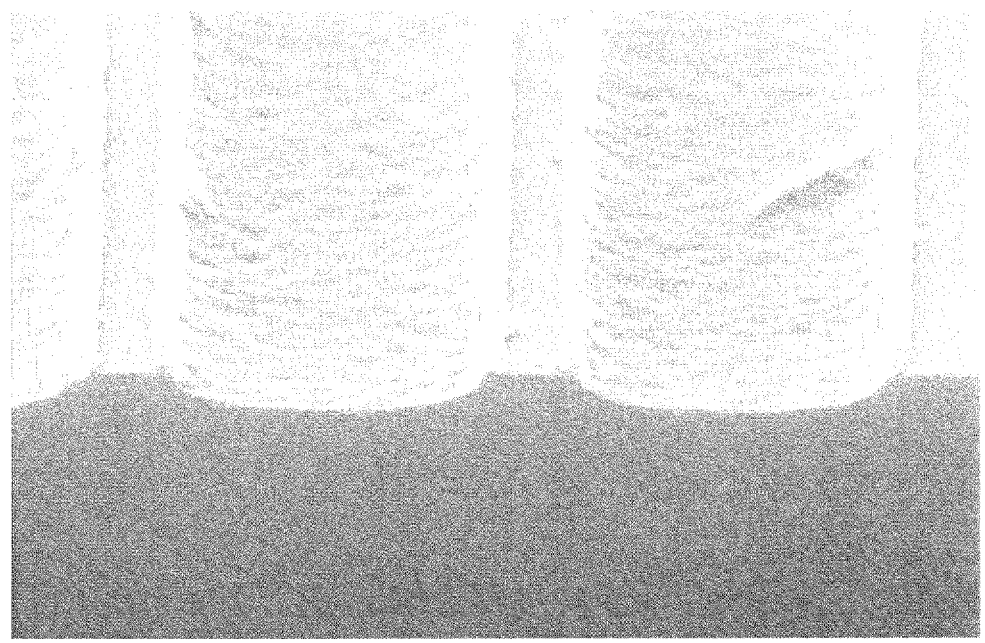
FIG. 24 is an SEM photograph of undercut-formed features from Example 5.
Figure 25:
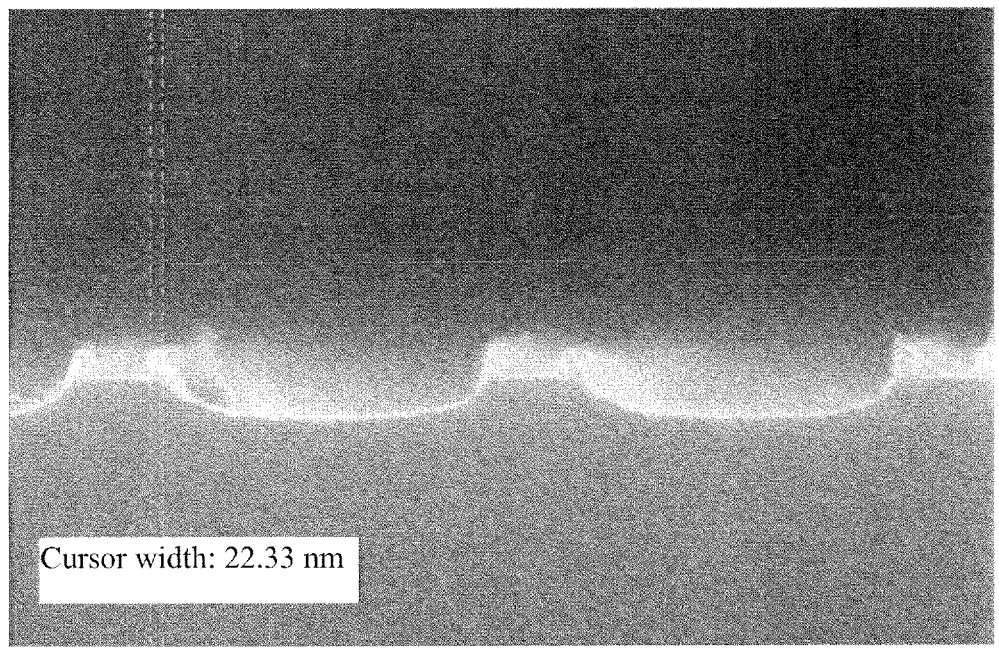
FIG. 25 is an SEM photograph cross-section view of undercut-formed features from Example showing the measured linewidth of the features.

A second patterned stack was prepared according to the procedure in Example 3. The undercut portions of the template structures were then filled with an etch-resistant material. An experimental silica nanoparticle colloidal fill material (Brewer Science) was spin-coated onto the patterned stack at 500 rpm for 30 seconds using a Brewer Science® Cee® CB200 coat/bake module, followed by baking at 100° C. for 60 seconds. A reactive ion etch was then performed on the stack using an Oxford etcher and $CF_4$ at 50 sccm as the etch gas. The stack was processed for 240 seconds at 100 watts of power, 10 mTorr pressure, and a DC-bias of 377. A second reactive ion etch was then performed using $O_2$ at 50 sccm, and the wafer was processed for 90 seconds at 100 watts of power, 60 mTorr pressure, and a DC-bias of 377. SEM images of the stack after removal of the T-shaped structures to leave behind the etch resistant material from the undercut portions are shown in FIGS. 24 and 25.

We claim:

1. A method of forming a microelectronic structure, said method comprising:
providing a wafer stack comprising a substrate having a surface, an optional intermediate layer adjacent said substrate surface, an undercuttable layer adjacent said substrate surface or optional intermediate layer, when present, and an imaging layer adjacent said undercuttable layer;
patterning said imaging layer to yield a pattern;
transferring said pattern into said undercuttable layer, wherein said transferring yields a first plurality of T-shaped structures on said substrate surface, or on an intermediate layer on said substrate surface, said T-shaped structures each comprising:
an upright leg having an upper portion and a lower portion joined by opposing vertical sidewalls that are generally perpendicular to said substrate surface, said lower portion contacting said substrate surface or intermediate layer; and a generally horizontal section being adjacent said upper portion, and generally perpendicular to said vertical sidewalls, said generally horizontal section comprising an upper surface and a lower surface joined by opposing endwalls, wherein each of said vertical sidewalls and said lower surface cooperatively define a first set of undercut areas;

filling said first set of undercut area with a selectively etchable composition; and removing said T-shaped structures to yield a first plurality of undercut-formed features on said substrate surface or intermediate layer, when present, wherein said undercut-formed features each have a width of from about 1 to about 100 nm.

2. The method of claim 1, wherein said patterning comprises:

exposing said imaging layer to light to yield light-exposed portions of the imaging layer; and contacting said imaging layer with a developer after light exposure so as to remove said light-exposed portions.

3. The method of claim 2, said undercuttable layer being developer-soluble, wherein said contacting removes portions of said undercuttable layer adjacent said light-exposed portions of the imaging layer to yield said T-shaped structures.

4. The method of claim 1, wherein said undercut areas each have a width defined as the greatest distance from said vertical sidewall to a plane defined by a respective endwall of less than about 100 nm.

5. The method of claim 1, wherein said undercut-formed features each have a width of less than about 20 nm.

6. The method of claim 1, wherein said undercut-formed features each have a height of from about 1 to about 100 nm.

7. The method of claim 1, wherein said filling comprises:

applying said selectively etchable composition to said stack, said selectively etchable composition flowing into said undercut areas and coating said substrate surface, or intermediate layer, when present, wherein said upright leg has a height, said selectively etchable composition being applied at an average thickness substantially equal to or greater than said height so as to contact said lower surface of said generally horizontal section of said T-shaped structure;

etching said selectively etchable composition, wherein said selectively etchable composition is substantially removed from said substrate surface, except in said undercut areas.

8. The method of claim 1, wherein said undercuttable layer is formed from a composition comprising a compound dispersed or dissolved in a solvent system, said compound being selected from the group consisting of polymers and oligomers of polyamic acids, acrylates, methacrylates, polyesters, and mixtures thereof.

9. The method of claim 1, wherein said selectively etchable composition comprises silicon- and/or metal-containing compounds, oxides thereof, and combinations thereof, dispersed or dissolved in a solvent system.

10. The method of claim 1, further comprising:

forming a second undercuttable layer adjacent said substrate surface or intermediate layer, when present, at an average thickness substantially equal to or greater than the height of said first plurality of undercut-formed features;

forming said second imaging layer on said second undercuttable layer and first plurality of undercut formed features;

patterning said second imaging layer to yield a second pattern;

transferring said second pattern into said second undercuttable layer, wherein said transferring yields a second plurality of T-shaped structures on said substrate surface, or on an intermediate layer on said substrate surface, each of said second T-shaped structures comprising:

an upright leg having an upper portion and a lower portion joined by opposing vertical sidewalls that are generally perpendicular to said substrate surface, and a core corresponding to said first plurality of undercut-formed features, said lower portion contacting said substrate surface or intermediate layer; and a generally horizontal section being adjacent said upper portion, and generally perpendicular to said vertical sidewalls, said generally horizontal section comprising an upper surface and a lower surface joined by opposing endwalls, wherein each of said vertical sidewalls and said lower surface cooperatively define a second set of undercut areas.

11. The method of claim 10, further comprising:

filling said second set of undercut area with a selectively etchable composition; and removing said vertical sidewalls and generally horizontal section of each of said second plurality of T-shaped structures to yield said first plurality of undercut-formed features, and a second plurality of undercut-formed features on said substrate surface or intermediate layer, when present.

12. The method of claim 11, wherein said filling said second set of undercut areas comprises:

applying said selectively etchable composition to said stack, said selectively etchable composition flowing into said second set of undercut areas and coating said substrate surface, or intermediate layer, when present, wherein said upright leg has a height, said selectively etchable composition being applied at an average thickness substantially equal to or greater than said height so as to contact said lower surface of said generally horizontal section of said second plurality of T-shaped structures;

etching said selectively etchable composition, wherein said selectively etchable composition is substantially removed from said substrate surface, except in said second set of undercut areas.

13. The method of claim 1, wherein said stack further comprises an intermediate layer between said imaging layer and said undercuttable layer, said intermediate layer being selected from the group consisting of anti-reflective coatings, primer layers, etch mask layers, and combinations thereof.

14. A method of forming a microelectronic structure, said method comprising:

providing a stack comprising a substrate having a surface, an optional intermediate layer adjacent said substrate surface, and a first pattern formed in and/or on said substrate surface or intermediate layer, when present, said first pattern comprising a plurality of initial features formed on said substrate surface or intermediate layer, wherein said initial features formed on said substrate surface or intermediate layer each have a height;

forming an undercuttable layer adjacent said substrate surface or intermediate layer, when present, at an average thickness substantially equal to or greater than the height of said initial features;
forming an imaging layer on said undercuttable layer and initial features;
patterning said imaging layer to yield a second pattern;
transferring said second pattern into said undercuttable layer, wherein said transferring yields a plurality of T-shaped structures on said substrate surface, or on an intermediate layer on said substrate surface, each of said T-shaped structures comprising:
an upright leg having an upper portion and a lower portion joined by opposing vertical sidewalls that are generally perpendicular to said substrate surface, and a core corresponding to said initial features, said lower portion contacting said substrate surface or intermediate layer; and
a generally horizontal section being adjacent said upper portion, and generally perpendicular to said vertical sidewalls, said generally horizontal section comprising an upper surface and a lower surface joined by opposing endwalls, wherein each of said vertical sidewalls and said lower surface cooperatively define a set of undercut areas; and
filling said set of undercut area with a selectively etchable composition.

15. The method of claim 14, further comprising:
removing said vertical sidewalls and generally horizontal section of each of said plurality of T-shaped structures to yield said initial features, and a plurality of undercut-formed features on said substrate surface or intermediate layer, when present.

16. The method of claim 15, wherein said filling comprises:
applying said selectively etchable composition to said stack, said selectively etchable composition flowing into said set of undercut areas and coating said substrate surface, or intermediate layer, when present, wherein said upright leg has a height, said selectively etchable composition being applied at an average thickness substantially equal to or greater than said height so as to contact said lower surface of said generally horizontal section of said plurality of T-shaped structures;
etching said selectively etchable composition, wherein said selectively etchable composition is substantially removed from said substrate surface, except in said set of undercut areas.

17. The method of claim 14, further comprising forming an intermediate layer between said undercuttable layer and said imaging layer, said intermediate layer being selected from the group consisting of anti-reflective coatings, primer layers, etch mask layers, and combinations thereof.

18. A method of forming a microelectronic structure, said method comprising:
providing a wafer stack comprising a substrate having a surface, an optional intermediate layer adjacent said substrate surface, an undercuttable layer adjacent said substrate surface or optional intermediate layer, when present, and an imaging layer adjacent said undercuttable layer;
patterning said imaging layer to yield a pattern, wherein said patterning comprises:
exposing said imaging layer to light to yield light-exposed portions of the imaging layer; and
contacting said imaging layer with a developer after light exposure so as to remove said light-exposed portions;
transferring said pattern into said undercuttable layer, wherein said transferring yields a first plurality of T-shaped structures on said substrate surface, or on an intermediate layer on said substrate surface, said T-shaped structures each comprising:
an upright leg having an upper portion and a lower portion joined by opposing vertical sidewalls that are generally perpendicular to said substrate surface, said lower portion contacting said substrate surface or intermediate layer; and
a generally horizontal section being adjacent said upper portion. and generally perpendicular to said vertical sidewalls, said generally horizontal section comprising an upper surface and a lower surface joined by opposing endwalls, wherein each of said vertical sidewalls and said lower surface cooperatively define a first set of undercut areas;
said undercuttable layer being developer-soluble, wherein said contacting removes portions of said undercuttable layer adjacent said light-exposed portions of the imaging layer to yield said T-shaped structures;
filling said first set of undercut area with a selectively etchable composition; and
removing said T-shaped structures to yield a first plurality of undercut-formed features on said substrate surface or intermediate layer, when present.

19. A method of forming a microelectronic structure, said method comprising:
providing a wafer stack comprising a substrate having a surface, an optional intermediate layer adjacent said substrate surface, an undercuttable layer adjacent said substrate surface or optional intermediate layer, when present, and an imaging layer adjacent said undercuttable layer;
patterning said imaging layer to yield a pattern;
transferring said pattern into said undercuttable layer, wherein said transferring yields a first plurality of T-shaped structures on said substrate surface, or on an intermediate layer on said substrate surface, said T-shaped structures each comprising:
an upright leg having an upper portion and a lower portion joined by opposing vertical sidewalls that are generally perpendicular to said substrate surface, said lower portion contacting said substrate surface or intermediate layer; and
a generally horizontal section being adjacent said upper portion, and generally perpendicular to said vertical sidewalls, said generally horizontal section comprising an upper surface and a lower surface joined by opposing endwalls, wherein each of said vertical sidewalk and said lower surface cooperatively define a first set of undercut areas;
filling said first set of undercut area with a selectively etchable composition;
removing said T-shaped structures to yield a first plurality of undercut-formed features on said substrate surface or intermediate layer, when present;
forming a second undercuttable layer adjacent said substrate surface or intermediate layer, when present, at an average thickness substantially equal to or greater than the height of said first plurality of undercut-formed features;

forming said second imaging layer on said second undercuttable layer and first plurality of undercut formed features;

patterning said second imaging layer to yield a second pattern;

transferring said second pattern into said second undercuttable layer, wherein said transferring yields a second plurality of T-shaped structures on said substrate surface, or on an intermediate layer on said substrate surface, each of said second T-shaped structures comprising:

an upright leg having an upper portion and a lower portion joined by opposing vertical sidewalls that are generally perpendicular to said substrate surface, and a core corresponding to said first plurality of undercut-formed features, said lower portion contacting said substrate surface or intermediate layer; and a generally horizontal section being adjacent said upper portion, and generally perpendicular to said vertical sidewalls, said generally horizontal section comprising an upper surface and a lower surface joined by opposing endwalls, wherein each of said vertical sidewalls and said lower surface cooperatively define a second set of undercut areas.

* * * * *